United States Patent
Watanabe et al.

(10) Patent No.: US 9,548,418 B2
(45) Date of Patent: *Jan. 17, 2017

(54) GALLIUM NITRIDE SELF-SUPPORTED SUBSTRATE, LIGHT-EMITTING DEVICE AND MANUFACTURING METHOD THEREFOR

(71) Applicant: NGK INSULATORS, LTD., Nagoya (JP)

(72) Inventors: Morimichi Watanabe, Nagoya (JP); Jun Yoshikawa, Nagoya (JP); Tsutomu Nanataki, Nagoya (JP); Katsuhiro Imai, Nagoya (JP); Tomohiko Sugiyama, Nagoya (JP); Takashi Yoshino, Nagoya (JP); Yukihisa Takeuchi, Nagoya (JP); Kei Sato, Nagoya (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/016,722

(22) Filed: Feb. 5, 2016

(65) Prior Publication Data

US 2016/0172541 A1 Jun. 16, 2016

Related U.S. Application Data

(63) Continuation of application No. 14/499,688, filed on Sep. 29, 2014, now Pat. No. 9,312,446, which is a
(Continued)

(30) Foreign Application Priority Data

| May 31, 2013 | (JP) | 2013-115753 |
| Dec. 18, 2013 | (JP) | 2013-260868 |
| Mar. 31, 2014 | (JP) | 2014-071342 |

(51) Int. Cl.
H01L 33/32 (2010.01)
H01L 33/00 (2010.01)
(Continued)

(52) U.S. Cl.
CPC ............... H01L 33/18 (2013.01); C30B 9/00 (2013.01); C30B 9/12 (2013.01); C30B 19/02 (2013.01);
(Continued)

(58) Field of Classification Search
CPC ...... H01L 33/32; H01L 33/0075; H01L 33/16; C30B 9/00; C30B 19/02; C30B 19/12; C30B 25/18; C30B 25/20; C30B 29/406
See application file for complete search history.

(56) References Cited

U.S. PATENT DOCUMENTS

| 2002/0011599 A1 | 1/2002 | Motoki et al. |
| 2002/0086534 A1 | 7/2002 | Cuomo et al. |

(Continued)

FOREIGN PATENT DOCUMENTS

| EP | 1 296 362 A2 | 3/2003 |
| JP | 09-027636 A1 | 1/1997 |

(Continued)

OTHER PUBLICATIONS

European Office Action from corresponding European patent application 14 195 195.4 bearing a mailing date of Feb. 11, 2016, 4 pages.
(Continued)

*Primary Examiner* — Whitney T Moore
(74) *Attorney, Agent, or Firm* — Burr & Brown, PLLC

(57) ABSTRACT

Provided is a self-supporting gallium nitride substrate useful as an alternative material for a gallium nitride single crystal substrate, which is inexpensive and also suitable for having
(Continued)

a large area. This substrate is composed of a plate composed of gallium nitride-based single crystal grains, wherein the plate has a single crystal structure in the approximately normal direction. This substrate can be manufactured by a method comprising providing an oriented polycrystalline sintered body; forming a seed crystal layer composed of gallium nitride on the sintered body so that the seed crystal layer has crystal orientation mostly in conformity with the crystal orientation of the sintered body; forming a layer with a thickness of 20 μm or greater composed of gallium nitride-based crystals on the seed crystal layer so that the layer has crystal orientation mostly in conformity with crystal orientation of the seed crystal layer; and removing the sintered body.

25 Claims, 4 Drawing Sheets

Related U.S. Application Data continuation-in-part of application No. PCT/JP2014/064388, filed on May 30, 2014.

(60) Provisional application No. 61/845,866, filed on Jul. 12, 2013.

(51) Int. Cl.
| | |
|---|---|
| H01L 33/16 | (2010.01) |
| C30B 29/40 | (2006.01) |
| C30B 19/12 | (2006.01) |
| C30B 9/00 | (2006.01) |
| C30B 25/20 | (2006.01) |
| C30B 19/02 | (2006.01) |
| H01L 33/18 | (2010.01) |
| C30B 9/12 | (2006.01) |
| C30B 25/18 | (2006.01) |
| C30B 28/04 | (2006.01) |
| C30B 29/60 | (2006.01) |

(52) U.S. Cl.
CPC ............... *C30B 19/12* (2013.01); *C30B 25/18* (2013.01); *C30B 25/20* (2013.01); *C30B 28/04* (2013.01); *C30B 29/406* (2013.01); *C30B 29/605* (2013.01); *H01L 33/0025* (2013.01); *H01L 33/0075* (2013.01); *H01L 33/16* (2013.01); *H01L 33/32* (2013.01)

(56) References Cited

U.S. PATENT DOCUMENTS

| | | |
|---|---|---|
| 2004/0089919 A1 | 5/2004 | Motoki et al. |
| 2004/0144300 A1 | 7/2004 | Kitaoka et al. |
| 2008/0315243 A1 | 12/2008 | Ueno et al. |
| 2010/0148174 A1 | 6/2010 | Nakahata et al. |
| 2013/0313567 A1 | 11/2013 | Furuya et al. |

FOREIGN PATENT DOCUMENTS

| | | |
|---|---|---|
| JP | 2004-359495 A1 | 12/2004 |
| JP | 2009-004569 A1 | 1/2009 |
| JP | 2009-073710 A1 | 4/2009 |
| JP | 2010-132556 A1 | 6/2010 |
| JP | 2012-184144 A1 | 9/2012 |
| WO | 02/44444 A1 | 6/2002 |
| WO | 2009/044638 A1 | 4/2009 |

OTHER PUBLICATIONS

International Search Report and Written Opinion (Application No. PCT/JP2014/064388) dated Jul. 1, 2014 (with English translation).
Japanese Office Action (Application No. 2014-199217) dated Jan. 16, 2015 (with English translation).
Extended European Search Report (Application No. 14195195.4) dated Apr. 7, 2015.
International Search Report and Written Opinion (Application No. PCT/JP2015/068391) dated Sep. 15, 2015 (with English translation).
Araki, Tsutomu, et al. "Crystal Growth and Characterization of Polycrystalline GaN on Silica Glass by ECR-MBE," *Journal of the JJACG*, vol. 30, No. 2 (2003).
Hageman, P.R., et al. "GaN growth on single-crystal diamond substrates by metalorganic chemical vapour deposition and hydride vapour deposition," *Thin Solid Films*, vol. 443 (2003).
Hu, F.R., et al. "Molecular beam epitaxial growth of GaN thin film on Si substrate with InN as interlayer," *Journal of Crystal Growth*, vol. 294 (2006).

Top surface side of substrate

GALLIUM NITRIDE SELF-SUPPORTED SUBSTRATE, LIGHT-EMITTING DEVICE AND MANUFACTURING METHOD THEREFOR

CROSS REFERENCE TO RELATED APPLICATIONS

This application is a continuation of U.S. application Ser. No. 14/499,688, filed Sep. 29, 2014, the entirety of which is incorporated herein by reference, which in turn is a continuation-in-part of International Application No. PCT/JP2014/064388, filed May 30, 2014, which designated the United States.

FIELD OF THE INVENTION

The present invention relates to a self-supporting gallium nitride substrate, a light emitting device, and manufacturing methods therefor.

BACKGROUND OF THE INVENTION

As light emitting devices such as light emitting diodes (LEDs) in which a single crystal substrate is used, light emitting devices in which various gallium nitride (GaN) layers are formed on sapphire (α-alumina single crystal) are known. For example, those having a structure formed by stacking on a sapphire substrate an n-type GaN layer, a multiple quantum well (MQW) layer in which a quantum well layer composed of an InGaN layer and a barrier layer composed of a GaN layer are alternately stacked, and a p-type GaN layer in this order are in mass production. Moreover, a multi-layer substrate suitable for such use is also proposed. For example, Patent Document 1 (JP2012-184144A) proposes a gallium nitride crystal multi-layer substrate including a sapphire base substrate and a gallium nitride crystal layer formed by crystal growth on the substrate.

When a GaN layer is formed on a sapphire substrate, dislocation is likely to occur because the lattice constant and the coefficient of thermal expansion of the GaN layer do not match with those of sapphire, which is a foreign substrate. Moreover, since sapphire is an insulating material, it is not possible to form an electrode on its surface, and, therefore, it is not possible to configure a light emitting device having a vertical structure that includes electrodes on the front and back of the device. Accordingly, LEDs in which various gallium nitride (GaN) layers are formed on a GaN single crystal have been attracting attention. Since a GaN single crystal substrate is made of the same type of material as a GaN layer, the lattice constants and the coefficients of thermal expansion are likely to match, and higher performance can be expected than the case where a sapphire substrate is used. For example, Patent Document 2 (JP2010-132556A) discloses a self-supporting n-type gallium nitride single crystal substrate having a thickness of 200 μm or greater.

CITATION LIST

Patent Document

Patent Document 1: JP2012-184144A
Patent Document 2: JP2010-132556A

SUMMARY OF THE INVENTION

However, single crystal substrates in general have small areas and are expensive. In particular, while there are demands for reduction of production costs of LEDs in which large-area substrates are used, it is not easy to mass-produce large-area single crystal substrates, and doing so results in even higher production costs. Accordingly, an inexpensive material that can be an alternative material for single crystal substrates of gallium nitride or the like is desired.

The inventors have currently found that a self-supporting gallium nitride substrate that is inexpensive and also suitable for having a large area can be produced as an alternative material for a gallium nitride single crystal substrate.

Therefore, an object of the present invention is to provide a self-supporting gallium nitride substrate useful as an alternative material for a gallium nitride single crystal substrate, which is inexpensive and also suitable for having a large area.

According to an aspect of the present invention, there is provided a self-supporting gallium nitride substrate composed of a plate composed of a plurality of gallium nitride-based single crystal grains, wherein the plate has a single crystal structure in an approximately normal direction.

According to another aspect of the present invention, there is provided a light emitting device comprising:
the self-supporting gallium nitride substrate according to the present invention; and
a light emitting functional layer formed on the substrate, wherein the light emitting functional layer has at least one layer composed of a plurality of semiconductor single crystal grains, wherein the at least one layer has a single crystal structure in an approximately normal direction.

According to yet another aspect of the present invention, there is provided a method for manufacturing a self-supporting gallium nitride substrate, comprising the steps of:
providing an oriented polycrystalline sintered body;
forming a seed crystal layer composed of gallium nitride on the oriented polycrystalline sintered body so that the seed crystal layer has crystal orientation mostly in conformity with crystal orientation of the oriented polycrystalline sintered body;
forming a layer with a thickness of 20 μm or greater composed of gallium nitride-based crystals on the seed crystal layer so that the layer has crystal orientation mostly in conformity with crystal orientation of the seed crystal layer; and
removing the oriented polycrystalline sintered body to obtain the self-supporting gallium nitride substrate.

According to yet another aspect of the present invention, there is provided a method for manufacturing a light emitting device, comprising the steps of:
providing the self-supporting gallium nitride substrate according to the present invention; and
forming on the self-supporting gallium nitride substrate at least one layer composed of a plurality of semiconductor single crystal grains, wherein the at least one layer has a single crystal structure in an approximately normal direction, so that the at least one layer has crystal orientation mostly in conformity with crystal orientation of the gallium nitride substrate, thereby providing a light emitting functional layer.

DETAILED DESCRIPTION OF THE INVENTION

Self-Supporting Gallium Nitride Substrate

Figure 1:
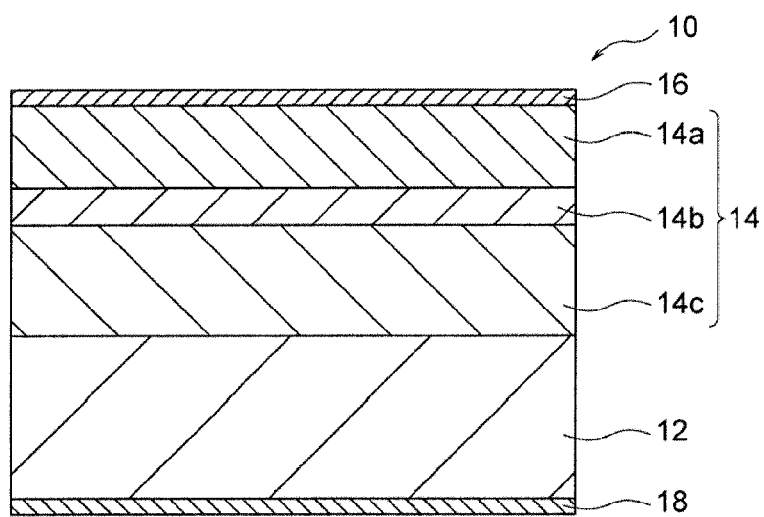
FIG. 1 is a schematic cross-sectional diagram showing one example of a vertical light emitting device produced using the self-supporting gallium nitride substrate of the present invention.

The gallium nitride substrate of the present invention can take the form of a self-supporting substrate. In the present invention, the "self-supporting substrate" means a substrate that does not become deformed or damaged by its own weight when handled and that can be handled as solid matter. The self-supporting gallium nitride substrate of the present invention is usable as a substrate for various semiconductor devices such as light emitting devices, and, in addition, it is usable as a component or a layer other than a substrate, such as an electrode (which may be a p-type electrode or an n-type electrode), a p-type layer, or an n-type layer. In the following description, advantages of the present invention may be described by way of a light emitting device as an example, which is one of the principal applications, but similar or analogous advantages are also applicable to other semiconductor devices as long as such advantages are not technically contradictory.

The self-supporting gallium nitride substrate of the present invention is composed of a plate composed of a plurality of gallium nitride-based single crystal grains, wherein the plate has a single crystal structure in the approximately normal direction. That is, the self-supporting gallium nitride substrate is composed of a plurality of semiconductor single crystal grains connected two-dimensionally in the direction in a horizontal plane, and, therefore, has a single crystal structure in the approximately normal direction. Therefore, although the self-supporting gallium nitride substrate is not a single crystal as a whole, the self-supporting gallium nitride substrate has a single crystal structure in terms of local domains, and can therefore have sufficiently high crystallinity for ensuring device properties such as light emitting function. Yet, the self-supporting gallium nitride substrate of the present invention is not a single crystal substrate. As described above, single crystal substrates in general have small areas and are expensive. In particular, while there are demands in recent years for reduction of production costs of LEDs in which large-area substrates are used, it is not easy to mass-produce large-area single crystal substrates, and doing so results in even higher production costs. These drawbacks are addressed by the self-supporting gallium nitride substrate of the present invention. That is, the present invention can provide a self-supporting gallium nitride substrate useful as an alternative material for a gallium nitride single crystal substrate, which is inexpensive and also suitable for having a large area. Moreover, by using gallium nitride having electroconductivity due to introduction of a p-type or n-type dopant as a substrate, it is possible to achieve a light emitting device having a vertical structure, and it is thereby possible to enhance luminance. In addition, a large-area surface light emitting device for use in surface emitting lightings or the like can be achieved at low cost. In particular, when a vertical LED structure is produced using the self-supporting gallium nitride substrate of the present invention, because the plurality of gallium nitride-based single crystal grains constituting the self-supporting substrate have a single crystal structure in the approximately normal direction, highly resistive grain boundaries do not exist in electrical current paths, and as a result, preferable luminous efficiency is expected. In this regard, in the case of an oriented polycrystalline substrate in which grain boundaries exist also in the normal direction, highly resistive grain boundaries exist in electrical current paths even when a vertical structure is formed, and thus there is a possibility of impaired luminous efficiency. From these viewpoints, the self-supporting gallium nitride substrate of the present invention can be preferably used also for a vertical LED structure.

Preferably, the plurality of gallium nitride-based single crystal grains constituting the self-supporting substrate have crystal orientation that is mostly aligned in the approximately normal direction. The "crystal orientation that is mostly aligned in the approximately normal direction" is not necessarily limited to crystal orientation that is completely aligned in the normal direction, and means that it may be crystal orientation that is, to some extent, in alignment with the normal or a direction similar thereto as long as desired device properties of devices such as light emitting devices including the self-supporting substrate can be ensured. Using an expression derived from the production method, it can also be said that the gallium nitride-based single crystal grains have a structure in which grains are grown mostly in conformity with the crystal orientation of an oriented polycrystalline sintered body used as a base substrate in producing the self-supporting gallium nitride substrate. The "structure in which grains are grown mostly in conformity with the crystal orientation of an oriented polycrystalline sintered body" means a structure resulting from crystal growth influenced by the crystal orientation of the oriented polycrystalline sintered body, is not necessarily limited to a structure in which grains are grown completely in conformity with the crystal orientation of the oriented polycrystalline sintered body, and may be a structure in which grains are grown, to some extent, in conformity with the crystal orientation of the oriented polycrystalline sintered body as long as desired device properties of devices such as light emitting devices in which the self-supporting substrate is used can be ensured. That is, this structure also includes a structure in which grains are grown in crystal orientation different from that of the oriented polycrystalline sintered body. In this sense, the expression "structure in which grains are grown mostly in conformity with crystal orientation" can be paraphrased as "structure in which grains are grown in a manner mostly derived from crystal orientation", and this paraphrasing and the above meaning similarly apply to similar expressions in this specification. Therefore, such crystal growth is preferably epitaxial growth, but it is not limited thereto, and may take a variety of similar crystal growth forms. In any case, with crystals grown in this way, the self-supporting gallium nitride substrate can have a structure, the crystal orientation of which is mostly aligned with respect to the approximately normal direction.

Therefore, the self-supporting gallium nitride substrate is observed as a single crystal when viewed in the normal direction, and it is also possible to recognize it as an aggregate of gallium nitride-based single crystal grains having a columnar structure in which grain boundary are observed in a view of the cross section in the horizontal plane direction. Here, the "columnar structure" does not mean only a typical vertically long columnar shape, and is defined as having a meaning encompassing various shapes such as a horizontally long shape, a trapezoidal shape, and an inverted trapezoidal shape. As described above, the self-supporting gallium nitride substrate may have a structure with crystal orientation that is, to some extent, in alignment with the normal or a direction similar thereto, and does not necessarily need to have a columnar structure in a strict sense. As described above, the growth of gallium nitride single crystal grains due to the influence of the crystal orientation of an oriented polycrystalline sintered body used for production of a self-supporting gallium nitride substrate is considered to be the cause of the columnar structure. Therefore, the average grain diameter at the cross section (hereinafter referred to as a cross-sectional average diameter) of gallium nitride single crystal grains that can also be called columnar structures is considered to depend on not only the conditions of film formation but also the average grain diameter at the plate surface of the oriented polycrystalline sintered body. In the case where the self-supporting gallium nitride substrate is used as a part of a light emitting functional layer of a light emitting device, the presence of grain boundaries impairs light transmittance in the cross-sectional direction and causes light to be scattered or reflected. Therefore, in the case of a light emitting device having a structure in which light is extracted in the normal direction, a luminance increasing effect due to scattered light from grain boundaries is also expected.

As described above, in the case where a vertical LED structure is formed using the self-supporting gallium nitride substrate of the present invention, it is preferable that the top surface of the self-supporting substrate on which a light emitting functional layer will be formed and the bottom surface of the self-supporting substrate on which an electrode will be formed connect without intervention of a grain boundary. That is, it is preferable that the gallium nitride-based single crystal grains exposed at the top surface of the self-supporting gallium nitride substrate connect to the bottom surface of the self-supporting gallium nitride substrate without intervention of a grain boundary. The presence of a grain boundary causes resistance when electricity is applied, and therefore becomes a factor that deter deteriorates luminous efficiency.

Meanwhile, when gallium nitride crystals are grown using epitaxial growth via a vapor phase or a liquid phase, growth occurs not only in the normal direction but also in the horizontal direction, depending on the conditions of film formation. At this time, if the quality of grains that serve as a starting point of growth or of seed crystals produced thereon varies, the growth rates of respective gallium nitride crystals differ, and, as conceptually shown in, for example, FIG. 5, fast-growing grains may grow to cover slow-growing grains. In the case of such a growth behavior, grains on the top surface side of the substrate are likely to have a larger diameter than those on the bottom surface side of the substrate. In this case, growth of slow-growing crystals terminates halfway, and a grain boundary can be observed also in the normal direction when a certain cross section is observed. However, the grains exposed at the top surface of the substrate connect to the bottom surface of the substrate without intervention of a grain boundary, and there is not a resistive phase against application of an electric current. In other words, after gallium nitride crystals are formed into a film, the grains exposed on the top surface side of the substrate (the side opposite to the side that was in contact with the base-substrate oriented polycrystalline sintered body during production) are predominantly grains that connect to the bottom surface without intervention of a grain boundary, and therefore it is preferable to produce a light emitting functional layer on the top surface side of the substrate from the viewpoint of increasing the luminous efficiency of an LED having a vertical structure. On the other hand, on the bottom surface side of the substrate (the side that was in contact with the base-substrate oriented polycrystalline sintered body during production), there are also grains that do not connect to the top surface of the substrate (see, for example, FIG. 5), and thus there is a possibility of impaired luminous efficiency if a light emitting functional layer is produced on the bottom surface side of the substrate. Moreover, as described above, in the case of such a growth behavior, grains develop to have a large diameter as they grow, and therefore, the top surface of the self-supporting gallium nitride substrate can be paraphrased as the side on which the grain diameter of gallium nitride crystals is larger, and the bottom surface thereof can be paraphrased as the side on which the grain diameter is smaller. That is, in the self-supporting gallium nitride substrate, it is preferable to produce a light emitting functional layer on the side where the grain diameter of gallium nitride crystals is larger (the top surface side of the substrate) from the viewpoint of increasing the luminous efficiency of an LED having a vertical structure. When an oriented polycrystalline alumina sintered body that is oriented along the c-plane or the like is used for a base substrate, the top surface side of the self-supporting gallium nitride substrate (the side opposite to the side that was in contact with the base-substrate oriented polycrystalline alumina sintered body during production) becomes the gallium surface, and the bottom surface side of the self-supporting gallium nitride substrate (the side that was in contact with the base-substrate oriented polycrystalline alumina sintered body during production) becomes the nitrogen surface. That is, at the gallium surface of the self-supporting gallium nitride substrate, grains connecting to the bottom surface without intervention of a grain boundary are predominant. Therefore, it is preferable to produce a light emitting functional layer on the gallium surface side (the top surface side of the substrate) from the viewpoint of increasing the luminous efficiency of an LED having a vertical structure.

Therefore, in the case where grains on the top surface side of the substrate exhibit such a growth behavior that their grain diameter is larger than that of grains on the bottom surface side of the substrate, or that is to say, in the case where the cross-sectional average diameter of gallium nitride-based single crystal grains exposed at the top surface of the substrate is larger than the cross-sectional average diameter of gallium nitride-based single crystal grains exposed at the bottom surface of the substrate, luminous efficiency is increased, and therefore such diameters are preferable (this can be paraphrased that it is preferable that the number of gallium nitride-based single crystal grains exposed at the top surface of the substrate is smaller than the number of gallium nitride-based single crystal grains exposed at the bottom surface of the substrate). Specifically, the ratio $D_T/D_B$, which is the ratio of the cross-sectional average diameter at the outermost surface of gallium nitride-based single crystal grains exposed at the top surface of the self-supporting gallium nitride substrate (hereinafter referred to as the cross-sectional average diameter $D_T$ at the top surface of the substrate) to the cross-sectional average diameter at the outermost surface of gallium nitride-based single crystal grains exposed at the bottom surface of the self-supporting gallium nitride substrate (hereinafter referred to as the cross-sectional average diameter $D_B$ at the bottom surface of the substrate), is preferably greater than 1.0, more preferably 1.5 or greater, even more preferably 2.0 or greater, particularly preferably 3.0 or greater, and most preferably 5.0 or greater. However, an excessively high $D_T/D_B$ ratio may in turn result in impaired luminous efficiency, and therefore a ratio of 20 or less is preferable, and 10 or less is more preferable. Although the cause of change in luminous efficiency is not clear, it is considered that when the ratio $D_T/D_B$ is high, the area of grain boundaries that do not contribute to light emission is reduced due to the increased grain diameter, or crystal defects are reduced due to the increased grain diameter. Although the cause of reduction in crystal defect is not clear either, it is also considered that defective grains grow slowly, and grains with less defects grow fast. On the other hand, when the ratio $D_T/D_B$ is excessively high, the cross-sectional diameter of grains that connect between the substrate top surface and the substrate bottom surface (i.e., grains exposed at the top surface side of the substrate) is small near the bottom surface side of the substrate. As a result, sufficient electric current paths are not obtained, which can be considered as a cause of reduction in luminous efficiency, but the details thereof are not clear.

Crystallinity at the interface between columnar structures constituting the self-supporting gallium nitride substrate is low, and therefore when the self-supporting gallium nitride substrate is used as a light emitting functional layer of a light emitting device, there is a possibility that the luminous efficiency deteriorates, the emission wavelength changes, and the emission wavelength broadens. Thus, a larger cross-sectional average diameter of the columnar structures is preferable. Preferably, the cross-sectional average diameter of semiconductor single crystal grains at the outermost surface of the self-supporting gallium nitride substrate is 0.3 μm or greater, more preferably 3 μm or greater, even more preferably 20 μm or greater, particularly preferably 50 μm or greater, and most preferably 70 μm or greater. Although the upper limit of the cross-sectional average diameter of the semiconductor single crystal grains at the outermost surface of the self-supporting gallium nitride substrate is not particularly limited, it is realistically 1000 μm or less, more realistically 500 μm or less, and even more realistically 200 μm or less. In order to produce semiconductor single crystal grains having such a cross-sectional average diameter, it is desirable that the sintered grain diameter at the plate surface of grains that constitute the oriented polycrystalline sintered body used for producing the self-supporting gallium nitride substrate is 0.3 μm to 1000 μm, more desirably 3 μm to 1000 μm, even more desirably 10 μm to 200 μm, and particularly desirably 14 μm to 200 μm. Alternatively, with a view to making the cross-sectional average diameter of semiconductor single crystal grains at the outermost surface of the self-supporting gallium nitride substrate larger than the cross-sectional average diameter at the bottom surface of the self-supporting substrate, it is desirable that the sintered grain diameter at the plate surface of grains constituting the oriented polycrystalline sintered body is 10 μm to 100 μm and more desirably 14 μm to 70 μm.

The gallium nitride-based single crystal grains constituting the self-supporting gallium nitride substrate may be free from a dopant. Here, the phrase "free from a dopant" means that an element that is added to impart a certain function or property is not contained, but, needless to say, inevitable impurities are allowed. Alternatively, the gallium nitride-based single crystal grains constituting the self-supporting gallium nitride substrate may be doped with an n-type dopant or a p-type dopant, and, in this case, the self-supporting gallium nitride substrate can be used as a component or a layer other than a substrate, such as a p-type electrode, an n-type electrode, a p-type layer, or an n-type layer. Preferable examples of p-type dopants include one or more selected from the group consisting of beryllium (Be), magnesium (Mg), calcium (Ca), strontium (Sr), zinc (Zn), and cadmium (Cd). Preferable examples of n-type dopants include one or more selected from the group consisting of silicon (Si), germanium (Ge), tin (Sn), and oxygen (O).

The gallium nitride-based single crystal grains constituting the self-supporting gallium nitride substrate may be formed into mixed crystals for band gap control. Preferably, the gallium nitride single crystal grains may be composed of gallium nitride formed into mixed crystals with crystals of one or more selected from the group consisting of AlN and InN, and p-type gallium nitride and/or n-type gallium nitride single crystal grains may be those in which such mixed-crystal gallium nitride is doped with a p-type dopant or an n-type dopant. For example, doping $Al_xGa_{1-x}N$, which is a mixed crystal of gallium nitride and AlN, with Mg makes it possible to provide a p-type substrate, and doping $Al_xGa_{1-x}N$ with Si makes it possible to provide an n-type substrate. When the self-supporting substrate is used as a light emitting functional layer of a light emitting device, forming gallium nitride into a mixed crystal with AlN widens the band gap and makes it possible to shift the emission wavelength toward the high energy side. Moreover, gallium nitride may be formed into a mixed crystal with InN, and this narrows the band gap and makes it possible to shift the emission wavelength toward the low energy side.

It is preferable that the self-supporting gallium nitride substrate has a size of 50.8 mm (2 inches) or greater in diameter, more preferably 100 mm (4 inches) or greater in diameter, and even more preferably 200 mm (8 inches) or greater in diameter. The larger the self-supporting gallium nitride substrate is, the greater the number of producible devices is, and therefore a larger size is preferable from the viewpoint of production cost, and is also preferable from the viewpoint of use in surface-light-emitting devices because the usable device area is enlarged so as to expand applications to surface-emitting lightings and the like. Therefore, the upper limits of the area and size thereof should not be specified. It is preferable that the self-supporting gallium nitride substrate is circular or substantially circular as viewed from above, but the shape is not limited thereto. When the self-supporting gallium nitride substrate is not circular or substantially circular, the area is preferably 2026 mm² or greater, more preferably 7850 mm² or greater, and even more preferably 31400 mm² or greater. For applications that do not require a large area, the area may be smaller than the above range such as 50.8 mm (2 inches) or less in diameter, or 2026 mm² or less in terms of area. The thickness of the self-supporting gallium nitride substrate needs to be capable of imparting self-supporting properties to the substrate, and is thus preferably 20 μm or greater, more preferably 100 μm or greater, and even more preferably 300 μm or greater. Although the upper limit of the thickness of the self-supporting gallium nitride substrate should not be specified, the thickness is realistically 3000 μm or less from the viewpoint of production cost.

The aspect ratio $T/D_T$, which is defined as the ratio of the thickness T of the self-supporting gallium nitride substrate to the cross-sectional average diameter $D_T$ at the outermost surface of gallium nitride-based single crystal grains exposed at the top surface of the self-supporting gallium nitride substrate, is preferably 0.7 or greater, more preferably 1.0 or greater, and even more preferably 3.0 or greater. This aspect ratio is preferable from the viewpoint of increasing luminous efficiency in the case of LEDs. As for the cause of increased luminous efficiency, it is considered that grains with a high aspect ratio result in a low defect density in gallium nitride, increased light extraction efficiency, and so on, but details thereof are not clear.

As described so far, from the viewpoint of increasing luminous efficiency, it is preferable that (1) a light emitting functional layer is produced on the top surface side of the self-supporting substrate (the side opposite to the side that was in contact with the base-substrate oriented polycrystalline sintered body during production), (2) the ratio $D_T/D_B$, which is the ratio of the cross-sectional average diameter $D_T$ of the substrate top surface to the cross-sectional average diameter $D_B$ of the substrate bottom surface, is at a suitable value, (3) the cross-sectional average diameter at the substrate outermost surface of grains constituting the self-supporting substrate is large, and (4) the aspect ratio $T/D_T$ of grains constituting the self-supporting substrate is large. From the viewpoints (3) and (4) above, it is preferable that the cross-sectional average diameter is large and the aspect ratio is large, or in other words, a gallium nitride crystal that has a large cross-sectional average diameter on the top surface side of the substrate and a large thickness is preferable. Moreover, from the self-supporting viewpoint, the thickness of the self-supporting gallium nitride substrate is preferably 20 µm or greater, more preferably 100 µm or greater, and even more preferably 300 µm or greater. However, as described above, a large thickness of a gallium nitride crystal is not preferable from the cost viewpoint, and as long as the substrate is self-supporting, a lower thickness is preferable. That is, the thickness of the self-supporting gallium nitride substrate is realistically 3000 µm or less, preferably 600 µm or less, and preferably 300 µm or less. Therefore, the thickness is preferably about 50 to 500 µm and more preferably about 50 to 300 µm from the viewpoint of allowing the substrate to be self-supporting and increasing the luminous efficiency as well as from the viewpoint of cost.

Manufacturing Method

The self-supporting gallium nitride substrate of the present invention can be manufactured by (1) providing an oriented polycrystalline sintered body, (2) forming a seed crystal layer composed of gallium nitride on the oriented polycrystalline sintered body so that the seed crystal layer has crystal orientation mostly in conformity with the crystal orientation of the oriented polycrystalline sintered body, (3) forming a layer with a thickness of 20 µm or greater composed of gallium nitride-based crystals on the seed crystal layer so that the layer has crystal orientation mostly in conformity with the crystal orientation of the seed crystal layer, and (4) removing the oriented polycrystalline sintered body to obtain the self-supporting gallium nitride substrate.

(1) Oriented Polycrystalline Sintered Body

An oriented polycrystalline sintered body is provided as a base substrate for producing a self-supporting gallium nitride substrate. Although the composition of the oriented polycrystalline sintered body is not particularly limited, the oriented polycrystalline sintered body is preferably one selected from an oriented polycrystalline alumina sintered body, an oriented polycrystalline zinc oxide sintered body, and an oriented polycrystalline aluminum nitride sintered body. The oriented polycrystalline sintered body can be efficiently manufactured through forming and firing using a commercially available plate-shaped powder, and thus is not only able to be produced at low cost but also suitable for having a large area due to ease in forming. According to the inventors' findings, by using an oriented polycrystalline sintered body as a base substrate and allowing a plurality of semiconductor single crystal grains to grow thereon, it is possible to manufacture a self-supporting gallium nitride substrate that is suitable for manufacturing large-area light emitting devices at low cost. As a result, the self-supporting gallium nitride substrate is extremely suitable for manufacturing large-area light emitting devices at low cost.

The oriented polycrystalline sintered body is composed of a sintered body that contains numerous single crystal grains which are to some extent or highly oriented in a certain direction. The use of a polycrystalline sintered body oriented in this way makes it possible to produce a self-supporting gallium nitride substrate having crystal orientation that is mostly aligned in the approximately normal direction, and when a gallium nitride-based material is formed on the self-supporting gallium nitride substrate by epitaxial growth or crystal growth similar thereto, a state in which crystal orientation is mostly aligned in the approximately normal direction is achieved. Accordingly, the use of such a highly oriented self-supporting gallium nitride substrate as a substrate for a light emitting device makes it possible to form a light emitting functional layer that is similarly in a state in which its crystal orientation is mostly aligned in the approximately normal direction and makes it possible to achieve high luminous efficiency identical to that obtained when a single crystal substrate is used. Alternatively, even when this highly oriented self-supporting gallium nitride substrate is used as a light emitting functional layer of a light emitting device, it is possible to achieve high luminous efficiency identical to that obtained when a single crystal substrate is used. In any case, in order to produce such a highly oriented self-supporting gallium nitride substrate, an oriented polycrystalline sintered body needs to be used as a base substrate. Although it is preferable that the oriented polycrystalline sintered body is transparent or translucent, the sintered body is not limited in this respect. In the case where the sintered body is transparent or translucent, a technique such as laser lift-off can be used for removing the oriented polycrystalline plate. In addition to commonly used pressureless sintering methods in which an air atmosphere furnace, a nitrogen atmosphere furnace, a hydrogen atmosphere furnace, or the like is used, pressure sintering methods such as hot isostatic pressing (HIP), hot pressing (HP), and spark plasma sintering (SPS), and combination thereof can be used as production methods for obtaining the oriented polycrystalline sintered body.

The oriented polycrystalline sintered body preferably has a size of 50.8 mm (2 inches) or greater in diameter, more preferably 100 mm (4 inches) or greater in diameter, and even more preferably 200 mm (8 inches) or greater in diameter. The larger the oriented polycrystalline sintered body is, the larger the area of the producible self-supporting gallium nitride substrate is and thus the more the number of producible light emitting devices is, and therefore a larger size is preferable from the viewpoint of production cost. Moreover, a larger size is also preferable from the viewpoint of use in surface-light-emitting devices because the usable device area is enlarged so as to expand applications to surface-emitting lightings and the like, and therefore, the upper limits of the area and size thereof should not be specified. It is preferable that the self-supporting gallium nitride substrate is circular or substantially circular as viewed from above, but the shape is not limited thereto. In the case where the self-supporting gallium nitride substrate is not circular or substantially circular, the area is preferably 2026 mm$^2$ or greater, more preferably 7850 mm$^2$ or greater, and even more preferably 31400 mm$^2$ or greater. For applications that do not require a large area, the area may be smaller than the above range such as 50.8 mm (2 inches) or less in diameter, or 2026 mm² or less in terms of area. Although the thickness of the oriented polycrystalline sintered body is not limited as long as it is self-supporting, an excessively large thickness is not preferable from the viewpoint of production cost. Therefore, the thickness is preferably 20 µm or greater, more preferably 100 µm or greater, and even more preferably 100 to 1000 µm. Meanwhile, In the case of forming gallium nitride into a film, the entire substrate may warp due to stress resulting from the difference between the thermal expansions of alumina and gallium nitride, thus adversely affecting the subsequent process. Although stress varies according to, for example, the method for forming a gallium nitride film, film formation conditions, materials of the oriented polycrystalline sintered body, film thickness, and substrate diameter, a thick oriented polycrystalline sintered body may be used as a base substrate as one technique of suppressing warpage due to stress. For example, in the case of producing a self-supporting gallium nitride substrate having a diameter of 50.8 mm (2 inches) and a thickness of 300 µm using an oriented polycrystalline alumina sintered body as a base oriented polycrystalline sintered body, the thickness of the oriented polycrystalline alumina sintered body may be 900 µm or greater, 1300 µm or greater, or 2000 µm or greater. In this way, the thickness of the oriented polycrystalline sintered body may be suitably selected in consideration of, for example, the viewpoint of production cost and the viewpoint of suppressing warpage.

The average grain diameter at the plate surface of grains constituting the oriented polycrystalline sintered body is preferably 0.3 to 1000 µm, more preferably 3 to 1000 µm, even more preferably 10 µm to 200 µm, and particularly preferably 14 µm to 200 µm. Alternatively, as described above, in the case of considering that the cross-sectional average diameter of semiconductor single crystal grains at the outermost surface of the self-supporting gallium nitride substrate is made larger than the cross-sectional average diameter at the bottom surface of the self-supporting substrate, the sintered grain diameter at the plate surface of grains constituting the oriented polycrystalline sintered body is preferably 10 µm to 100 µm and more preferably 14 µm to 70 µm. The overall average grain diameter of the oriented polycrystalline sintered body correlates with the average grain diameter at the plate surface, and when the diameter is within these ranges, the sintered body is excellent in terms of mechanical strength and is easy to be handled. Moreover, when a light emitting device is produced by forming a light emitting functional layer in the upper part and/or the interior of a self-supporting gallium nitride substrate produced using an oriented polycrystalline sintered body, the luminous efficiency of the light emitting functional layer is also excellent. The average grain diameter at the plate surface of sintered body grains in the present invention is measured by the following method. That is, the plate surface of a plate-shaped sintered body is polished, and an image is taken with a scanning electron microscope. The visual field range is determined in a way such that when straight lines are diagonally drawn on the obtained image, each straight line crosses 10 to 30 grains. The average grain diameter at the plate surface is determined by diagonally drawing two straight lines on the obtained image, taking the average of the line segment lengths inside all grains crossed by the straight lines, and multiplying the average by 1.5. When the boundary of sintered body grains cannot be clearly determined on the scanning microscope image of the plate surface, the above evaluation may be carried out after performing processing to emphasize the boundary by thermal etching (for example, for 45 minutes at 1550° C.) or chemical etching.

A particularly preferable oriented polycrystalline sintered body is an oriented polycrystalline alumina sintered body. Alumina is aluminum oxide ($Al_2O_3$) and is typically α-alumina having the same corundum-type structure as single crystal sapphire, and the oriented polycrystalline alumina sintered body is a solid in which a countless number of alumina crystal grains in an oriented state are bonded to each other by sintering. Alumina crystal grains contain alumina and may contain a dopant and an inevitable impurity as other elements, or that may be composed of alumina and an inevitable impurity. The oriented polycrystalline alumina sintered body may contain an additive as a sintering aid in a grain boundary phase. Although the oriented polycrystalline alumina sintered body may also contain another phase or another element as described above in addition to alumina crystal grains, preferably the oriented polycrystalline alumina sintered body is composed of alumina crystal grains and an inevitable impurity. The oriented plane of the oriented polycrystalline alumina sintered body is not particularly limited and may be a c-plane, an a-plane, an r-plane, an m-plane, or the like.

The direction in which crystals are oriented in the oriented polycrystalline alumina sintered body is not particularly limited, and it may be the direction of a c-plane, an a-plane, an r-plane, an m-plane, or the like, and from the viewpoint of lattice constant matching with the self-supporting gallium nitride substrate, it is preferable that crystals are oriented along the c-plane. As for the degree of orientation, for example, the degree of orientation at the plate surface is preferably 50% or greater, more preferably 65% or greater, even more preferably 75% or greater, particularly preferably 85% or greater, particularly more preferably 90% or greater, and most preferably 95% or greater. The degree of orientation can be determined by measuring an XRD profile through irradiating the plate surface of plate-shaped alumina with X rays using an XRD apparatus (such as RINT-TTR III manufactured by Rigaku Corporation) and calculating according to the formulae below.

$$\text{Degree of Orientation [\%]} = \frac{p - p_0}{1 - p_0} \times 100 \quad \text{[Mathematical Formula 1]}$$

$$p_0 = \frac{I_0(hkl)}{\sum I_0(hkl)}$$

$$p = \frac{I_s(hkl)}{\sum I_s(hkl)}$$

where $I_0(hkl)$ and $I_S(hkl)$ are the integral values)($2\theta=20-70°$ of the diffraction intensities from the (hkl) planes in ICDD No. 461212 and a sample, respectively.

The crystallinity of constitutive grains of the self-supporting gallium nitride substrate tends to be high, and the density of defects such as dislocation can be kept low. Accordingly, it is considered that, in some applications such as light emitting devices, it is even possible to use the self-supporting gallium nitride substrate more preferably than a gallium nitride single crystal substrate. For example, when a functional layer is produced on the self-supporting gallium nitride substrate by epitaxial growth, the functional layer grows mostly in conformity with the base self-supporting gallium nitride substrate and becomes an aggregate of columnar structures. In epitaxial growth, the crystal quality of the base is inherited, and therefore it is possible to obtain high crystal quality in each domain of columnar structures constituting the functional layer. Although the reason why the crystal grains constituting the self-supporting gallium nitride substrate has a low defect density is not clear, it is presumed that among the lattice defects occurring during the initial stage of production of the self-supporting gallium nitride substrate, those that develop with tilt toward the horizontal direction are absorbed by the grain boundary as growth progresses, and thus disappear.

From the viewpoint of lowering the density of defects such as dislocation contained in the self-supporting gallium nitride substrate, it is more preferable that when producing the self-supporting gallium nitride substrate, some or all grains constituting the outermost surface of the oriented polycrystalline sintered body that serves as a base substrate are arranged so as to be slightly tilted randomly from a certain direction (such as a c-plane, an a-plane, or a like reference direction). Approximately all or a certain amount of the tilted grains may be tilted at an approximately constant angle, or may be tilted at various angles and/or in various directions so as to have a distribution within a certain range (preferably 0.01 to 20°). Moreover, tilted grains and non-tilted grains may be intermixed in a desired proportion. Alternatively, the plate surface of the oriented polycrystalline alumina sintered body may be obliquely polished relative to the reference plane to allow the exposed surface of the grains to be tilted in a certain direction, or a plane slightly tilted from the reference direction of the grains at the outermost surface may be exposed by processing into a wave-like form or the like. In any of the above cases, it is preferable that some or all alumina single crystal grains constituting the outermost surface of the oriented polycrystalline sintered body oriented in a reference direction such as a c-plane or an a-plane are arranged in a tilted manner so that their reference orientation is shifted within a range of 0.5 to 20° from the normal direction of the substrate.

The oriented polycrystalline alumina sintered body can be manufactured by forming and sintering, using a plate-shaped alumina powder as a raw material. A plate-shaped alumina powder is sold in the market and is commercially available. Although the type and the shape of the plate-shaped alumina powder are not particularly limited as long as a dense oriented polycrystalline alumina sintered body can be obtained, the average grain diameter may be 0.4 to 15 μm and the thickness may be 0.05 to 1 μm, and a mixture of two or more raw materials having different average grain diameters within this range may be used. Preferably, a plate-shaped alumina powder can be formed into an oriented green body by a technique that uses shearing force. Preferable examples of techniques that use shearing force include tape casting, extrusion molding, doctor blade method, and any combination of these. In the orientation technique that uses shearing force, it is preferable, in any technique exemplified above, that additives such as a binder, a plasticizer, a dispersing agent, and a dispersion medium are suitably added to the plate-shaped alumina powder to form a slurry, and the slurry is allowed to pass through a slit-shaped narrow discharge port to discharge and form the slurry into a sheet on a base. The slit width of the discharge port is preferably 10 to 400 μm. The amount of the dispersion medium is adjusted so that the viscosity of the slurry is preferably 5000 to 100000 cP and more preferably 20000 to 60000 cP. The thickness of the oriented green body formed into a sheet is preferably 5 to 500 μm and more preferably 10 to 200 μm. It is preferable that numerous pieces of this oriented green body that has been formed into a sheet are stacked on top of the other to form a precursor laminate having a desired thickness, and press molding is performed on this precursor laminate. This press molding can be preferably performed by packing the precursor laminate in a vacuum pack or the like and subjecting it to isostatic pressing in hot water at 50 to 95° C. under a pressure of 10 to 2000 kgf/cm². Moreover, the oriented green body that has been formed into a sheet, or the precursor laminate, may be subjected to processing by a roll press method (such as a heating roll press or a calender roll). Moreover, when extrusion molding is used, the flow channel within a metal mold may be designed so that after passing through a narrow discharge port within the metal mold, sheets of the green body are integrated into a single body within the metal mold, and the green body is ejected in a laminated state. It is preferable to degrease the resulting green body in accordance with known conditions. The oriented green body obtained in the above manner is fired by, in addition to ordinal pressureless firing using an air atmosphere furnace, a nitrogen atmosphere furnace, a hydrogen atmosphere furnace, or the like, pressure sintering methods such as hot isostatic pressing (HIP), hot pressing (HP), and spark plasma sintering (SPS), and combination thereof, to form an alumina sintered body containing oriented alumina crystal grains. Although the firing temperature and the firing time in the above firing depend on the firing method, the firing temperature may be 1000 to 1950° C., preferably 1100 to 1900° C., and more preferably 1500 to 1800° C., and the firing time may be 1 minute to 10 hours and preferably 30 minutes to 5 hours. Form the viewpoint of promoting densification, firing is preferably performed through a first firing step of firing the green body with a hot pressing under conditions of 1500 to 1800° C., 2 to 5 hours, and a surface pressure of 100 to 200 kgf/cm², and a second firing step of re-firing the resulting sintered body with hot isostatic pressing (HIP) under conditions of 1500 to 1800° C., 30 minutes to 5 hours, and a gas pressure of 1000 to 2000 kgf/cm². Although the firing time at the aforementioned firing temperature is not particularly limited, it is preferably 1 to 10 hours and more preferably 2 to 5 hours. In the case of imparting translucency, a preferable example is a method in which a high-purity plate-shaped alumina powder is used as a raw material and fired in an air atmosphere furnace, a hydrogen atmosphere furnace, a nitrogen atmosphere furnace, or the like at 1100 to 1800° C. for 1 minute to 10 hours. A method may be used in which the resulting sintered body is re-fired with hot isostatic pressing (HIP) under conditions of 1200 to 1400° C. or 1400 to 1950° C., 30 minutes to 5 hours, and a gas pressure of 300 to 2000 kgf/cm². The fewer the grain boundary phases are, the more preferable it is, and therefore it is preferable that the plate-shaped alumina powder has high purity, and more preferably the purity is 98% or higher, even more preferably 99% or higher, particularly preferably 99.9% or higher, and most preferably 99.99% or higher. The firing conditions are not limited to those described above, and the second firing step with, for example, hot isostatic pressing (HIP) may be omitted as long as densification and high orientation can be simultaneously achieved. Moreover, an extremely small amount of additive may be added to the raw material as a sintering aid. Addition of a sintering aid, although it is contradictory to reducing the amount of grain boundary phase, is for reducing pores that are one of the factors causing scattering of light and, as a result, increasing translucency. Examples of such sintering aids include at least one selected from oxides such as MgO, $ZrO_2$, $Y_2O_3$, CaO, $SiO_2$, $TiO_2$, $Fe_2O_3$, $Mn_2O_3$, and $La_2O_3$, fluorides such as $AlF_3$, $MgF_2$, and $YbF_3$, and the like. Among these, MgO, CaO, $SiO_2$, and $La_2O_3$ are preferable, and MgO is particularly preferable. However, from the translucency viewpoint, the amount of additive should be limited to the smallest necessary level, and is preferably 5000 ppm or less, more preferably 1000 ppm or less, and even more preferably 700 ppm or less.

Moreover, the oriented polycrystalline alumina sintered body can be produced also by forming and sintering, using a mixed powder in which a plate-shaped alumina powder is suitably added to a fine alumina powder and/or transition alumina powder as a raw material. In this production method, crystal growth and densification occur through a so-called TGG (Templated Grain Growth) process in which the plate-shaped alumina powder serves as a seed crystal (template), the fine alumina powder and/or transition alumina powder serves as a matrix, and the template grows homoepitaxially while incorporating the matrix. As for the grain diameters of the plate-shaped alumina grains serving as a template and of the matrix, the larger the grain diameter ratio thereof is, the more easily the grains grow. For example, when the average grain diameter of the template is 0.5 to 15 µm, the average grain diameter of the matrix is preferably 0.4 µm or less, more preferably 0.2 µm or less, and even more preferably 0.1 µm or less. Although the mixing ratio of the template and the matrix varies according to the grain diameter ratio, firing conditions, and presence or absence of an additive, the template/matrix ratio may be 50/50 to 1/99 wt % when, for example, a plate-shaped alumina powder having an average grain diameter of 2 µm is used for the template and a fine alumina powder having an average grain diameter of 0.1 µm is used for the matrix. From the viewpoint of promoting densification, at least one selected from oxides such as $MgO$, $ZrO_2$, $Y_2O_3$, $CaO$, $SiO_2$, $TiO_2$, $Fe_2O_3$, $Mn_2O_3$, and $La_2O_3$, fluorides such as $AlF_3$, $MgF_2$, and $YbF_3$, and the like may be added as a sintering aid, and $MgO$, $CaO$, $SiO_2$, and $La_2O_3$ are preferable, and $MgO$ is particularly preferable. In such a technique as well, a high-quality oriented polycrystalline alumina sintered body can be obtained by the aforementioned pressure sintering methods such as hot isostatic pressing (HIP), hot pressing (HP), and spark plasma sintering (SPS), and combination thereof, in addition to ordinal pressureless firing using an air atmosphere furnace, a nitrogen atmosphere furnace, a hydrogen atmosphere furnace, or the like.

The alumina sintered body obtained in this way is a polycrystalline alumina sintered body oriented in the direction of a desired plane such as a c-plane in accordance with the type of the aforementioned raw-material plate-shaped alumina powder. It is preferable that the oriented polycrystalline alumina sintered body obtained in this way is ground with grinding wheel to flatten the plate surface, and then the plate surface is smoothed by lapping using diamond abrasive grains to obtain an oriented alumina substrate.

(2) Formation of Seed Crystal Layer

A seed crystal layer composed of gallium nitride is formed on the oriented polycrystalline sintered body so that the seed crystal layer has crystal orientation that is mostly in conformity with the crystal orientation of the oriented polycrystalline sintered body. The phrase "formed so that the seed crystal layer has crystal orientation that is mostly in conformity with the crystal orientation of the oriented polycrystalline sintered body" means a structure resulting from crystal growth influenced by the crystal orientation of the oriented polycrystalline sintered body, and it is not necessarily limited to a structure in which grains are grown completely in conformity with the crystal orientation of the oriented polycrystalline sintered body and also includes a structure in which grains grow in a crystal orientation different from that of the oriented polycrystalline sintered body. A method for producing a seed crystal layer is not particularly limited, and preferable examples include vapor phase methods such as MOCVD (metal organic chemical vapor deposition), MBE (molecular beam epitaxy), HVPE (halide vapor phase epitaxy), and sputtering, liquid phase methods such as Na flux method, ammonothermal method, hydrothermal method, and sol-gel method, powder methods that utilize solid phase growth of powder, and combinations of these. For example, formation of a seed crystal layer by MOCVD is preferably performed by depositing a 20-50 nm thick low-temperature GaN layer at 450 to 550° C. and laminating a GaN film having a thickness of 2 to 4 µm at 1000 to 1200° C.

(3) Formation of Gallium Nitride-Based Crystal Layer

A layer with a thickness of 20 µm or greater composed of gallium nitride-based crystals is formed on the seed crystal layer so that the layer has crystal orientation that is mostly in conformity with the crystal orientation of the seed crystal layer. A method for forming a layer composed of gallium nitride-based crystals is not particularly limited as long as the layer has crystal orientation that is mostly in conformity with the crystal orientation of the oriented polycrystalline sintered body and/or the seed crystal layer. Preferable examples include vapor phase methods such as MOCVD and HYPE, liquid phase methods such as Na flux method, ammonothermal method, hydrothermal method, and sol-gel method, powder methods that utilize solid phase growth of powder, and combinations of these, and it is particularly preferable that the layer is formed by Na flux method. A highly crystalline, thick gallium nitride crystal layer can be efficiently produced on the seed crystal layer by Na flux method. It is preferable that formation of a gallium nitride-based crystal layer by Na flux method is performed by filling a crucible containing a seed crystal substrate with a melt composition containing metal Ga and metal Na and optionally a dopant (e.g., an n-type dopant such as germanium (Ge), silicon (Si), or oxygen (O), or a p-type dopant such as beryllium (Be), magnesium (Mg), calcium (Ca), strontium (Sr), zinc (Zn), or cadmium (Cd)), increasing the temperature and the pressure to 830 to 910° C. and 3.5 to 4.5 MPa in a nitrogen atmosphere, and then rotating the crucible while retaining the temperature and the pressure. Although the retention time depends on the intended film thickness, it may be about 10 to 100 hours. Moreover, it is preferable that the gallium nitride crystals obtained by Na flux method are ground with grinding wheel to flatten the plate surface, and then the plate surface is smoothed by lapping using diamond abrasive grains.

(4) Removal of Oriented Polycrystalline Sintered Body

The self-supporting gallium nitride substrate can be obtained by removing the oriented polycrystalline sintered body. A method for removing the oriented polycrystalline sintered body is not particularly limited, and examples include grinding, chemical etching, interfacial heating by laser irradiation from the oriented sintered body side (laser lift-off), spontaneous separation utilizing a difference in thermal expansion when the temperature is increased, and the like.

Light Emitting Device and Manufacturing Method Therefor

A high-quality light emitting device can be produced using the self-supporting gallium nitride substrate of the present invention described above. Neither the structure of the light emitting device including the self-supporting gallium nitride substrate of the present invention nor the production method therefor is particularly limited. Typically, it is preferable that the light emitting device is produced by providing a light emitting functional layer on the self-supporting gallium nitride substrate, and formation of this light emitting functional layer is performed by forming at least one layer composed of a plurality of semiconductor single crystal grains, wherein the at least one layer has a single crystal structure in the approximately normal direction so that the at least one layer has crystal orientation mostly in conformity with the crystal orientation of the gallium nitride substrate. The self-supporting gallium nitride substrate may be used as a component or a layer other than a base material, such as an electrode (which may be a p-type electrode or an n-type electrode), a p-type, layer, an n-type layer, or the like, to produce a light emitting device. The device size is not particularly limited, and the device may be a small device having no greater than 5 mm×5 mm or may be a surface-emitting device having no less than 10 cm×10 cm.

FIG. 1 schematically shows the layer structure of a light emitting device according to one embodiment of the present invention. A light emitting device 10 shown in FIG. 1 includes a self-supporting gallium nitride substrate 12 and a light emitting functional layer 14 formed on this substrate. The light emitting functional layer 14 has at least one layer composed of a plurality of semiconductor single crystal grains, wherein the at least one layer has a single crystal structure in the approximately normal direction. This light emitting functional layer 14 emits light based on the principle of light emitting devices such as LEDs by suitably providing electrodes and the like and applying voltage. In particular, by using the self-supporting gallium nitride substrate 12 of the present invention, it can also be expected to obtain a light emitting device having luminous efficiency equivalent to that when a gallium nitride single crystal substrate is used, and a significant cost reduction can be achieved. Moreover, by using gallium nitride substrate provided with electroconductivity by introducing a p-type or n-type dopant, it is possible to achieve a light emitting device having a vertical structure, and it is thereby possible to increase luminance. In addition, a large-area surface emitting device can be achieved at low cost.

The light emitting functional layer 14 is formed on the substrate 12. The light emitting functional layer 14 may be formed on the entire surface or a part of the substrate 12, or when a buffer layer as described later is formed on the substrate 12, the light emitting functional layer 14 may be formed on the entire surface or a part of the buffer layer in the case. The light emitting functional layer 14 has at least one layer composed of a plurality of semiconductor single crystal grains wherein the at least one layer has a single crystal structure in the approximately normal direction, and can take a variety of known layer configurations that bring about light emission based on the principle of light emitting devices represented by LEDs by suitably providing an electrode and/or a phosphor and applying voltage. Therefore, the light emitting functional layer 14 may emit visible light such as blue or red, or may emit ultraviolet light with or without visible light. It is preferable that the light emitting functional layer 14 constitutes at least part of a light emitting device that utilizes a p-n junction, and this p-n junction may include an active layer 14b between a p-type layer 14a and an n-type layer 14c as shown in FIG. 1. At this time, a double heterojunction or a single heterojunction (hereinafter collectively referred to as a heterojunction) in which a layer having a smaller band gap than the p-type layer and/or the n-type layer is used as the active layer may be used. Moreover, as one form of p-type layer/active layer/n-type layer, a quantum well structure in which the thickness of the active layer is made small can be adopted. Needless to say, in order to obtain a quantum well, a double heterojunction should be employed in which the band gap of the active layer is made smaller than those of the p-type layer and the n-type layer. Moreover, a multiple quantum well structure (MQW) may be used in which a large number of such quantum well structures are stacked. Adopting these structures makes it possible to increase luminous efficiency in comparison to a p-n junction. In this way, it is preferable that the light emitting functional layer 14 includes a p-n junction and/or a heterojunction and/or a quantum well junction having a light emitting function.

Therefore, the at least one layer constituting the light emitting functional layer 14 can include at least one selected from the group consisting of an n-type layer doped with an n-type dopant, a p-type layer doped with a p-type dopant, and an active layer. The n-type layer, the p-type layer, and the active layer (if present) may be composed of materials whose main components are the same or different to each other.

The material of each layer constituting the light emitting functional layer 14 is not particularly limited as long as it grows mostly in conformity with the crystal orientation of the self-supporting gallium nitride substrate and has a light emitting function, and is preferably composed of a material whose main component is at least one selected from gallium nitride (GaN)-based materials, zinc oxide (ZnO)-based materials, and aluminum nitride (AlN)-based materials, and may suitably contain a dopant for controlling it to be a p-type or an n-type. A particularly preferable material is a gallium nitride (GaN)-based material, which is the same type of material as the self-supporting gallium nitride substrate. Moreover, the material constituting the light emitting functional layer 14 may be a mixed crystal in which AlN, InN, or the like forms a solid solution with GaN, for controlling the band gap thereof. Moreover, as described in the last paragraph, the light emitting functional layer 14 may be a heterojunction composed of multiple types of material systems. For example, a gallium nitride (GaN)-based material may be used for the p-type layer, and a zinc oxide (ZnO)-based material may be used for the n-type layer. Moreover, a zinc oxide (ZnO)-based material may be used for the p-type layer, a gallium nitride (GaN)-based material may be used for the active layer as well as the n-type layer, and there is not a particular limitation to material combinations.

The each layer constituting the light emitting functional layer 14 is composed of a plurality of semiconductor single crystal grains, wherein the layer has a single crystal structure in the approximately normal direction. That is, each layer is composed of a plurality of semiconductor single crystal grains connected two-dimensionally in the direction of a horizontal plane, and, therefore, has a single crystal structure in the approximately normal direction. Therefore, although each layer of the light emitting functional layer 14 is not a single crystal as a whole, it has a single crystal structure in terms of local domains, and can therefore have sufficiently high crystallinity for ensuring a light emitting function. Preferably, the semiconductor single crystal grains constituting the respective layers of the light emitting functional layer 14 have a structure in which grains are grown mostly in conformity with the crystal orientation of the self-supporting gallium nitride substrate, which is the substrate 12. The "structure in which grains are grown mostly in conformity with the crystal orientation of the self-supporting gallium nitride substrate" means a structure resulting from crystal growth influenced by the crystal orientation of the self-supporting gallium nitride substrate, and it is not necessarily limited to a structure in which grains are grown completely in conformity with the crystal orientation of the self-supporting gallium nitride substrate, and may be a structure in which grains are grown, to some extent, in conformity with the crystal orientation of the self-supporting gallium nitride substrate as long as a desired light emitting function can be ensured. That is, this structure also includes a structure in which grains are grown in crystal orientation different from that of the oriented polycrystalline sintered body. In this sense, the expression "structure in which grains are grown mostly in conformity with crystal orientation" can be paraphrased as "structure in which grains are grown in a manner mostly derived from crystal orientation". Therefore, such crystal growth is preferably epitaxial growth, but it is not limited thereto, and may take a variety of similar crystal growth forms. In particular, when the layers respectively constituting the n-type layer, the active layer, the p-type layer, and the like grow in the same crystal orientation as the self-supporting gallium nitride substrate, the structure is such that the crystal orientation from the self-supporting gallium nitride substrate to each layer of the light emitting functional layer is mostly aligned with respect to the approximately normal direction, and favorable light emitting properties can be obtained. That is, when the light emitting functional layer 14 also grows mostly in conformity with the crystal orientation of the self-supporting gallium nitride substrate 12, the orientation is mostly uniform in the direction perpendicular to the substrate. Accordingly, a state identical to a single crystal is attained in the normal direction, and by using a self-supporting gallium nitride substrate to which an n-type dopant is added, a light emitting device having a vertical structure can be formed in which the self-supporting gallium nitride substrate is used as a cathode, while by using a self-supporting gallium nitride substrate to which a p-type dopant is added, a light emitting device having a vertical structure can be formed in which the self-supporting gallium nitride substrate is used as an anode.

When at least the layers, such as the n-type layer, the active layer, and the p-type layer, constituting the light emitting functional layer 14 grow in the same crystal orientation, each layer is observed as a single crystal when viewed in the normal direction, and thus it is also possible to recognize it as an aggregate of semiconductor single crystal grains having a columnar structure in which a grain boundary is observed when the cross section in the direction of a horizontal plane is viewed. Here, the "columnar structure" does not mean only a typical vertically long columnar shape, and is defined as having a meaning encompassing various shapes such as a horizontally long shape, a trapezoidal shape, and an inverted trapezoidal shape. As described above, each layer may have a structure in which grains are grown, to some extent, in conformity with the crystal orientation of the self-supporting gallium nitride substrate, and does not necessarily need to have a columnar structure in a strict sense. As described above, the growth of gallium nitride single crystal grains due to the influence of the crystal orientation of the self-supporting gallium nitride substrate, which is the substrate 12, is considered to be the cause of the columnar structure. Therefore, the average grain diameter at the cross section (hereinafter referred to as a cross-sectional average diameter) of semiconductor single crystal grains that can also be called columnar structures is considered to depend on not only the conditions of film formation but also the average grain diameter at the plate surface of the self-supporting gallium nitride substrate. The interface of columnar structures constituting the light emitting functional layer influences luminous efficiency and emission wavelength, and the presence of grain boundaries impairs light transmittance in the cross-sectional direction and causes light to be scattered or reflected. Therefore, in the case of a structure from which light is extracted in the normal direction, a luminance increasing effect due to scattered light from grain boundaries is also expected.

Crystallinity at the interface between columnar structures constituting the light emitting functional layer 14 is low, and therefore there is a possibility that the luminous efficiency deteriorates, the emission wavelength changes, and the emission wavelength broadens. Therefore, a larger cross-sectional average diameter of the columnar structures is preferable. Preferably, the cross-sectional average diameter of the semiconductor single crystal grains at the outermost surface of the light emitting functional layer 14 is 0.3 µm or greater, more preferably 3 µm or greater, even more preferably 20 µm or greater, particularly preferably 50 µm or greater, and most preferably 70 µm or greater. Although the upper limit of this cross-sectional average diameter is not particularly defined, it is realistically 1000 µm or less, more realistically 500 µm or less, and even more realistically 200 µm or less. In order to produce semiconductor single crystal grains having such a cross-sectional average diameter, it is desirable that the cross-sectional average diameter at the outermost surface of the substrate of gallium nitride-based single crystal grains that constitute the self-supporting gallium nitride substrate is 0.3 µm to 1000 µm and more desirably 3 µm or greater.

In the case where a material other than a gallium nitride (GaN)-based material is partially or entirely used for the light emitting functional layer 14, a buffer layer may be provided between the self-supporting gallium nitride substrate 12 and the light emitting functional layer 14 for inhibiting a reaction. The main component of such a buffer layer is not particularly limited, and it is preferable that the buffer layer is composed of a material, the main component of which is at least one selected from zinc oxide (ZnO)-based materials and aluminum nitride (AlN)-based materials, and may suitably contain a dopant for controlling it to be a p-type or an n-type.

It is preferable that each layer constituting the light emitting functional layer 14 is composed of a gallium nitride-based material. For example, an n-type gallium nitride layer and a p-type gallium nitride layer may be grown in this order on the self-supporting gallium nitride substrate 12, or the order of stacking the p-type gallium nitride layer and the n-type gallium nitride layer may be inverse. Preferable examples of p-type dopants used for the p-type gallium nitride layer include one or more selected from the group consisting of beryllium (Be), magnesium (Mg), calcium (Ca), strontium (Sr), zinc (Zn), and cadmium (Cd). Preferable examples of n-type dopants used for the n-type gallium nitride layer include one or more selected from the group consisting of silicon (Si), germanium (Ge), tin (Sn), and oxygen (O). Moreover, the p-type gallium nitride layer and/or the n-type gallium nitride layer may be composed of gallium nitride formed into a mixed crystal with a crystal of one or more selected from the group consisting of AlN and InN, and the p-type layer and/or the n-type layer may be this mixed-crystal gallium nitride doped with a p-type dopant or an n-type dopant. For example, doping $Al_xGa_{1-x}N$, which is a mixed crystal of gallium nitride and AlN, with Mg makes it possible to provide a p-type layer, and doping $Al_xGa_{1-x}N$ with Si makes it possible to provide an n-type layer. Forming gallium nitride into a mixed crystal with AlN widens the band gap and makes it possible to shift the emission wavelength toward the high energy side. Moreover, gallium nitride may be formed into a mixed crystal with InN, and this narrows the band gap and makes it possible to shift the emission wavelength toward the low energy side. Between the p-type gallium nitride layer and the n-type gallium nitride layer, there may be an active layer composed of GaN or a mixed crystal of GaN and one or more selected from the group consisting of AlN and InN, that has a smaller band gap than both layers. The active layer has a structure that forms a double heterojunction with a p-type layer and an n-type layer, and a configuration in which this active layer is made thin corresponds to the light emitting device having a quantum well structure, which is one form of a p-n junction, and luminous efficiency can be further increased. Moreover, the active layer may be configured to have a smaller band gap than either layer and be composed of GaN or a mixed crystal of GaN and one or more selected from the group consisting of AlN and InN. Luminous efficiency can be further increased also by such a single heterojunction. The gallium nitride-based buffer layer may be composed of non-doped GaN or n-type or p-type-doped GaN, may contain AlN or InN having a close lattice constant, or may be a mixed crystal formed with GaN and one or more crystals selected from the group consisting of AlN and InN.

The light emitting functional layer 14 may be composed of a plurality of material systems selected from gallium nitride (GaN)-based materials, zinc oxide (ZnO)-based materials, and aluminum nitride (AlN)-based materials. For example, a p-type gallium nitride layer and an n-type zinc oxide layer may be grown on the self-supporting gallium nitride substrate 12, and the order of stacking the p-type gallium nitride layer and the n-type zinc oxide layer may be inverse. In the case where the self-supporting gallium nitride substrate 12 is used as a part of the light emitting functional layer 14, an n-type or p-type zinc oxide layer may be formed. Preferable examples of p-type dopants used for the p-type zinc oxide layer include one or more selected from the group consisting of nitrogen (N), phosphorus (P), arsenic (As), carbon (C), lithium (Li), sodium (Na), potassium (K), silver (Ag), and copper (Cu). Moreover, preferable examples of n-type dopants used for the n-type zinc oxide layer include one or more selected from the group consisting of aluminum (Al), gallium (Ga), indium (In), boron (B), fluorine (F), chlorine (Cl), bromine (Br), iodine (I), and silicon (Si).

A method for forming films of the light emitting functional layer 14 and the buffer layer is not particularly limited as long as it allows growth mostly in conformity with the crystal orientation of the self-supporting gallium nitride substrate, and preferable examples include vapor phase methods such as MOCVD, MBE, HVPE, and sputtering, liquid phase methods such as Na flux method, ammonothermal method, hydrothermal method, and sol-gel method, powder methods that utilize solid phase growth of powder, and combinations of these. For example, in the case where the light emitting functional layer 14 composed of a gallium nitride-based material is produced using MOCVD, at least an organic metal gas containing gallium (Ga) (such as trimethylgallium) and a gas containing at least nitrogen (N) (such as ammonia) as raw materials may be flown over a substrate to allow growth in, for example, an atmosphere containing hydrogen, nitrogen, or both within a temperature range of about 300 to 1200° C. In this case, film formation may be performed by suitably introducing an organic metal gas containing indium (In) or aluminum (Al) for band gap control as well as silicon (Si) or magnesium (Mg) as an n-type and p-type dopant (such as trimethylindium, trimethylaluminum, monosilane, disilane, and bis-cyclopentadienylmagnesium).

Moreover, in the case where materials other than gallium nitride-based materials are used for the light emitting functional layer 14 and the buffer layer, a film of a seed crystal layer may be formed on the self-supporting gallium nitride substrate. A method for forming a film of the seed crystal layer and a material are not particularly limited as long as crystal growth that is mostly in conformity with the crystal orientation is promoted. For example, when a zinc oxide-based material is used for a part of or all of the light emitting functional layer 14, an extremely thin zinc oxide seed crystal may be produced using a vapor phase growth method such as MOCVD, MBE, HVPE, or sputtering.

An electrode layer 16 and/or a phosphor layer may be further provided on the light emitting functional layer 14. As described above, since a light emitting device including the electroconductive self-supporting gallium nitride substrate 12 can have a vertical structure, an electrode layer 18 can also be formed on the bottom surface of the self-supporting gallium nitride substrate 12 as shown in FIG. 1, but the self-supporting gallium nitride substrate 12 itself may be used as an electrode, and in this case, it is preferable that an n-type dopant is added to the self-supporting gallium nitride substrate 12. The electrode layers 16 and 18 may be composed of known electrode materials, and configuring the electrode layer 16 on the light emitting functional layer 14 to be a transparent conductive film such as ITO or a metal electrode with a lattice structure or the like having a high aperture ratio is preferable for being able to increase the efficiency of extracting light produced in the light emitting functional layer 14.

When the light emitting functional layer 14 can emit ultraviolet light, a phosphor layer for converting ultraviolet light into visible light may be provided on the outer side of the electrode layer. The phosphor layer may be a layer containing a known fluorescent component capable of converting ultraviolet rays into visible light, and is not particularly limited. For example, preferable is such a configuration that a fluorescent component that becomes excited by ultraviolet light and emits blue light, a fluorescent component that becomes excited by ultraviolet light and emits blue to green light, and a fluorescent component that becomes excited by ultraviolet light and emits red light are allowed to be concomitantly present to obtain white light as a mixed color. Preferable combinations of such fluorescent components include $(Ca,Sr)_5(PO_4)_3Cl:Eu$, $BaMgAl_{10}O_{17}:Eu$ and Mn, and $Y_2O_3S:Eu$, and it is preferable to disperse these components in a resin such as silicone resin to form a phosphor layer. Such fluorescent components are not limited to components exemplified above, and other ultraviolet-excited phosphors such as yttrium aluminum garnet (YAG), silicate phosphors, and oxynitride-based phosphors may be combined.

On the other hand, when the light emitting functional layer 14 can emit blue light, a phosphor layer for converting blue light into yellow light may be provided on the outer side of the electrode layer. The phosphor layer may be a layer containing a known fluorescent component capable of converting blue light into yellow light, and is not particularly limited. For example, it may be a combination with a phosphor that emits yellow light, such as YAG. Accordingly, a pseudo-white light source can be obtained because blue light that has passed through the phosphor layer and yellow light from the phosphor are complementary. The phosphor layer may be configured to perform both conversion of ultraviolet light into visible light and conversion of blue light into yellow light by including both a fluorescent component that converts blue into yellow and a fluorescent component that converts ultraviolet light into visible light.

Applications

The self-supporting gallium nitride substrate of the present invention can be preferably used in not only the above-described light emitting device but also various applications such as various electronic devices, power devices, photodetectors, and solar cell wafers.

EXAMPLES

The present invention will now be more specifically described by way of the following examples.

Example 1

(1) Production of c-Plane Oriented Alumina Sintered Body

As a raw material, a plate-shaped alumina powder (manufactured by Kinsei Matec Co., Ltd., grade 00610) was provided. 7 parts by weight of a binder (polyvinyl butyral: lot number BM-2, manufactured by Sekisui Chemical Co., Ltd.), 3.5 parts by weight of a plasticizer (DOP: di(2-ethylhexyl) phthalate, manufactured by Kurogane Kasei Co., Ltd.), 2 parts by weight of a dispersing agent (Rheodol SP-O30, manufactured by Kao Corporation), and a dispersion medium (2-ethylhexanol) were mixed with 100 parts by weight of the plate-shaped alumina particles. The amount of the dispersion medium was adjusted so that the slurry viscosity was 20000 cP. The slurry prepared as above was formed into a sheet on a PET film by a doctor blade method so as to have a dry thickness of 20 μm. The resulting tape was cut into circles having a diameter of 50.8 mm (2 inches), then 150 pieces were stacked and placed on an Al plate having a thickness of 10 mm, and then vacuum packing was performed. This vacuum pack was subjected to isostatic pressing in hot water at 85° C. under a pressure of 100 kgf/cm$^2$, and a disc-shaped green body was obtained.

The resulting green body was placed in a degreasing furnace and degreased under conditions of 600° C. and 10 hours. The resulting degreased body was fired in a hot pressing under conditions of 1600° C., 4 hours, and a surface pressure of 200 kgf/cm$^2$ in nitrogen using a graphite mold. The resulting sintered body was re-fired under conditions of 1700° C., 2 hours, and a gas pressure of 1500 kgf/cm$^2$ in argon by hot isostatic pressing (HIP).

The sintered body obtained in this way was fixed to a ceramic surface plate and ground to #2000 using grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 1 nm.

(2) Evaluation of Oriented Alumina Substrate (Evaluation of Degree of Orientation)

To check the degree of orientation of the resulting oriented alumina substrate, the degree of orientation at the c-plane, which is the measurement-target crystal plane in this experimental example, was measured by XRD. An XRD profile obtained when irradiating the plate surface of the oriented alumina substrate with X rays was measured within the range of $2\theta=20-70°$ using an XRD apparatus (RINT-TTR III manufactured by Rigaku Corporation). The degree of c-plane orientation was calculated according to the following formulae. As a result, the value of the degree of c-plane orientation in this experimental example was 97%.

[Mathematical Formula 2]

$$\text{Degree of } c\text{-Plane Orientation [\%]} = \frac{p - p_0}{1 - p_0} \times 100$$

$$p_0 = \frac{I_0(006)}{\sum I_0(hkl)}$$

$$p = \frac{I_s(006)}{\sum I_s(hkl)}$$

where $I_0(hkl)$ and $I_S(hkl)$ are the diffraction intensities (integral values) from the (hkl) planes in ICDD No. 461212 and a sample, respectively.

(Grain Diameter Evaluation of Sintered Body Grains)

Concerning the sintered body grains of the oriented alumina substrate, the average grain diameter at the plate surface was measured by the following method. The plate surface of the resulting oriented alumina substrate was polished and subjected to thermal etching at 1550° C. for 45 minutes, and then an image was taken with a scanning electron microscope. The visual field range was determined in a way such that when straight lines were diagonally drawn on the obtained image, each straight line crossed 10 to 30 grains. The average grain diameter at the plate surface was determined by diagonally drawing two straight lines on the obtained image, taking the average of the line segment lengths inside all grains crossed by the straight lines, and multiplying the average by 1.5. As a result, the average grain diameter at the plate surface was 100 μm.

(3) Production of Ge-Doped Self-Supporting Gallium Nitride Substrate (3a) Film Formation of Seed Crystal Layer Next, a seed crystal layer was formed on the processed oriented alumina substrate using MOCVD. Specifically, a 40 nm thick low-temperature GaN layer was deposited at 530° C., and then a GaN film having a thickness of 3 μm was laminated at 1050° C. to obtain a seed crystal substrate.

(3b) Film Formation of Ge-Doped GaN Layer by Na Flux Method

The seed crystal substrate produced in the above process was placed in the bottom of a cylindrical, flat-bottomed alumina crucible having an inner diameter of 80 mm and a height of 45 mm, and then the crucible was filled with a melt composition in a glovebox. The composition of the melt composition is as follows.

Metal Ga: 60 g
Metal Na: 60 g
Germanium tetrachloride: 1.85 g

This alumina crucible was put in a vessel made of a refractory metal and sealed, and then placed on a rotatable rack of a crystal growth furnace. After the temperature and the pressure were increased to 870° C. and 4.0 MPa in a nitrogen atmosphere, the solution was maintained for 50 hours while being rotated, and gallium nitride crystals were allowed to grow while stirring. After the end of crystal growth, the growth vessel was cooled slowly back to room temperature for 3 hours, and then the growth vessel was taken out from the crystal growth furnace. The melt composition remaining in the crucible was removed using ethanol, and a sample in which gallium nitride crystals grew was recovered. In the resulting sample, Ge-doped gallium nitride crystals grew on the entire surface of the 50.8 mm (2 inches) seed crystal substrate, and the crystal thickness was about 0.5 mm. No cracks were observed.

The oriented alumina substrate portion of the sample obtained in this way was removed by grinding with grinding wheel to obtain Ge-doped gallium nitride single body. The plate surface of this Ge-doped gallium nitride crystal was ground with #600 and #2000 grinding wheels to flatten the plate surface, and then the plate surface was smoothed by lapping using diamond abrasive grains to obtain a self-supporting Ge-doped gallium nitride substrate having a thickness of about 300 μm. In the smoothing processing, flatness was improved by reducing the size of abrasive grains from 3 μm to 0.1 μm in a stepwise manner. The average roughness Ra of the surface of the self-supporting gallium nitride substrate after processing was 0.2 nm.

Although an n-type semiconductor was produced by germanium doping in this example, doping may be performed using a different element or doping may not be performed depending on the application and the structure.
(Evaluation of Volume Resistivity)

The in-plane volume resistivity of the self-supporting gallium nitride substrate was measured using a Hall effect analyzer. As a result, the volume resistivity was $1 \times 10^{-2}$ Ω·cm.

(Evaluation of Cross-Sectional Average Diameter of Self-Supporting Gallium Nitride Substrate)

In order to measure the cross-sectional average diameter of GaN single crystal grains at the outermost surface of the self-supporting gallium nitride substrate, an image of the top surface of the self-supporting substrate was taken with a scanning electron microscope. The visual field range was determined in a way such that when straight lines were diagonally drawn on the obtained image, the straight lines crossed 10 to 30 columnar structures. The cross-sectional average grain diameter of GaN single crystal grains at the outermost surface of the self-supporting gallium nitride substrate was determined by diagonally drawing two straight lines on the obtained image, taking the average of the line segment lengths inside all grains crossed by the straight lines, and multiplying the average by 1.5. As a result, the cross-sectional average diameter was about 100 μm. In this example, it was possible to clearly determine the interface on the scanning microscope image of the top surface, but the above evaluation may be carried out after performing processing to emphasize the interface by thermal etching or chemical etching.

(4) Production of Light Emitting Device Including Ge-Doped Self-Supporting Gallium Nitride Substrate (4a) Film Formation of Light Emitting Functional Layer by MOCVD Using MOCVD, a 1 μm thick n-GaN layer doped to give a Si atom concentration of $5 \times 10^{18}$/cm$^3$ was deposited at 1050° C. as an n-type layer on the self-supporting gallium nitride substrate. Next, a multiple quantum well layer was deposited at 750° C. as a light emitting layer. Specifically, five 2.5 nm thick InGaN well layers and six 10 nm thick GaN barrier layers were alternately stacked. Next, a 200 nm thick p-GaN doped to give a Mg atom concentration of $1 \times 10^{19}$/cm$^3$ was deposited at 950° C. as a p-type layer. Thereafter, the sample was taken out from the MOCVD apparatus, and 800° C. heat treatment was performed for 10 minutes in a nitrogen atmosphere as activation treatment of Mg ions of the p-type layer. In order to measure the cross-sectional average diameter of single crystal grains at the outermost surface of the light emitting functional layer, an image of the top surface of the light emitting functional layer was taken with a scanning electron microscope. The visual field range was determined in a way such that when straight lines were diagonally drawn on the obtained image, the straight lines crossed 10 to 30 columnar structures. The cross-sectional average grain diameter of single crystal grains at the outermost surface of the light emitting functional layer was determined by diagonally drawing two straight lines on the obtained image, taking the average of the line segment lengths inside all grains crossed by the straight lines, and multiplying the average by 1.5. As a result, the cross-sectional average diameter was about 100 μm.

(4b) Production of Light Emitting Device

Using a photolithography process and a vacuum deposition method, Ti/Al/Ni/Au films as a cathode electrode were patterned on the surface on the side opposite to the n-GaN layer and the p-GaN layer of the self-supporting gallium nitride substrate in a thickness of 15 nm, 70 nm, 12 nm, and 60 nm, respectively. Thereafter, to improve ohmic contact characteristics, 700° C. heat treatment was performed in a nitrogen atmosphere for 30 seconds. Furthermore, using a photolithography process and a vacuum deposition method, Ni/Au films were patterned as a translucent anode electrode on the p-type layer in a thickness of 6 nm and 12 nm, respectively. Thereafter, to improve ohmic contact characteristics, 500° C. heat treatment was performed in a nitrogen atmosphere for 30 seconds. Furthermore, using a photolithography process and a vacuum deposition method, Ni/Au films that served as an anode electrode pad were patterned in a thickness of 5 nm and 60 nm, respectively, on a partial area of the top surface of the aforementioned Ni/Au films as a translucent anode electrode. The wafer obtained in this way was cut into a chip and, further, furnished with a lead frame to obtain a light emitting device having a vertical structure.

(4c) Evaluation of Light Emitting Device

When electricity was applied across the cathode electrode and the anode electrode and I-V measurement was performed, rectifying characteristics were confirmed. Moreover, when an electric current was applied in the forward direction, emission of light having a wavelength of 450 nm was confirmed.

Example 2

(1) Production of Mg-Doped Self-Supporting Gallium Nitride Substrate

A seed crystal substrate in which a GaN film having a thickness of 3 μm was stacked on an oriented alumina substrate was produced by a method similar to (1) to (3) of Example 1. A Mg-doped GaN film was formed on this seed crystal substrate as in (3b) of Example 1 except that the composition of the melt composition was as follows.
Metal Ga: 60 g
Metal Na: 60 g
Metal Mg: 0.02 g In the resulting sample, Mg-doped gallium nitride crystals grew on the entire surface of the 50.8 mm (2 inches) seed crystal substrate, and the crystal thickness was about 0.5 mm. No cracks were observed. Moreover, the Mg concentration in the resulting gallium nitride was $4 \times 10^{19}/cm^3$, and the Hall concentration measured using a Hall effect analyzer was $1 \times 10^{18}/cm^3$. The oriented alumina substrate portion of the sample obtained in this way was removed by grinding with grinding wheel to obtain a Mg-doped gallium nitride single body. The plate surface of this Mg-doped gallium nitride crystal was ground with #600 and #2000 grinding wheels to flatten the plate surface, and then the plate surface was smoothed by lapping using diamond abrasive grains to obtain a Mg-doped self-supporting gallium nitride substrate having a thickness of about 150 μm. In the smoothing processing, flatness was improved by reducing the size of abrasive grains from 3 μm to 0.1 μm in a stepwise manner. The average roughness Ra of the surface of the Mg-doped self-supporting gallium nitride substrate after processing was 0.2 nm. Measurement of the cross-sectional average diameter of the Mg-doped self-supporting gallium nitride substrate by a method similar to (3b) of Example 1 resulted in a cross-sectional average diameter of about 100 μm.

(2) Production of Light Emitting Device Including Mg-Doped Self-Supporting Gallium Nitride Substrate (2a) Film Formation of p-Type Layer by MOCVD Using MOCVD, a 200 nm thick p-GaN doped to give a Mg atom concentration of $1 \times 10^{19}/cm^3$ was deposited at 950° C. as a p-type layer on a substrate. Thereafter, the sample was taken out from the MOCVD apparatus, and 800° C. heat treatment was performed for 10 minutes in a nitrogen atmosphere as activation treatment of Mg ions of the p-type layer.

(2b) Film Formation of n-Type Layer by RS-MBE and Hydrothermal Method (2b-1) Film Formation of Seed Crystal Layer by RS-MBE Using an RS-MBE (radical source molecular beam epitaxy) apparatus, zinc (Zn) and aluminum (Al), which are metal materials, were irradiated in a Knudsen cell and supplied onto the p-type layer. Oxygen (O), which is a gaseous material, was supplied as an oxygen radical with an RF radical generator in which $O_2$ gas was used as a raw material. As for the purity of various raw materials that were used, the purity for Zn was 7N while that for $O_2$ was 6N. The substrate was heated to 700° C. using a resistance heater, and a film of an Al-doped n-ZnO seed crystal layer having a thickness of 20 nm was formed while controlling the flux of various gas sources so that the Al concentration was $2 \times 10^{18}/cm^3$ and the ratio of the Zn atom concentration to the O atom concentration was 1 to 1 in the film.

(2b-2) Film Formation of n-Type Layer by Hydrothermal Method

Zinc nitrate was dissolved in pure water so as to be 0.1 M to give solution A. Next, 1 M aqueous ammonia was provided as solution B. Next, aluminium sulfate was dissolved in pure water so as to be 0.1 M to give solution C. These solutions were mixed and stirred so that the volume ratio was solution A:solution B:solution C=1:1:0.01 to obtain an aqueous growth solution.

The self-supporting gallium nitride substrate on which a film of a seed crystal layer had been formed was placed upright in 1 liter of the aqueous growth solution. Next, a waterproofed ceramic heater and a magnetic stirrer were placed in the aqueous solution, the aqueous solution was placed in an autoclave to perform hydrothermal treatment at 270° C. for 3 hours, and a ZnO layer was precipitated on the seed crystal layer. The self-supporting gallium nitride substrate on which a ZnO layer had been deposited was washed with pure water, and then annealing treatment was performed at 500° C. in air to form an Al-doped n-ZnO layer having a thickness of about 3 μm. Neither pores nor cracks were detected in the sample, and electroconductivity of the ZnO layer was confirmed by using a tester. As a result of evaluating the cross-sectional average diameter of the light emitting functional layer using a method similar to (4a) of Example 1, the cross-sectional average diameter of single crystal grains at the outermost surface of the light emitting functional layer was about 100 μm.

(2c) Production of Light Emitting Device

Using a photolithography process and a vacuum deposition method, Ti/Al/Ni/Au films as a cathode electrode were patterned on the n-type layer in a thickness of 15 nm, 70 nm, 12 nm, and 60 nm, respectively. The cathode electrode was patterned into a shape having an opening so that light can be extracted from a portion where an electrode was not formed. Thereafter, to improve ohmic contact characteristics, 700° C. heat treatment was performed in a nitrogen atmosphere for 30 seconds. Moreover, using a photolithography process and a vacuum deposition method, Ni/Au films as an anode electrode were patterned on the surface on the side opposite to the p-GaN layer and the n-ZnO layer of the self-supporting gallium nitride substrate in a thickness of 50 nm and 100 nm, respectively. Thereafter, to improve ohmic contact characteristics, 500° C. heat treatment was performed in a nitrogen atmosphere for 30 seconds. The wafer obtained in this way was cut into a chip and, further, furnished with a lead frame to obtain a light emitting device having a vertical structure.

(2d) Evaluation of Light Emitting Device

When electricity was applied across the cathode electrode and the anode electrode and I-V measurement was performed, rectifying characteristics were confirmed. Moreover, when an electric current was applied in the forward direction, emission of light having a wavelength of about 380 nm was confirmed.

Example 3

(1) Production of Light Emitting Device Including Mg-Doped Self-Supporting Gallium Nitride Substrate (1a) Film Formation of Active Layer by RS-MBE A Mg-doped self-supporting gallium nitride substrate was produced by a method similar to (1) and (2a) of Example 2, and 200 nm thick p-GaN was deposited on the substrate as a p-type layer. Next, using an RS-MBE (radical source molecular beam epitaxy) apparatus, zinc (Zn) and cadmium (Cd), which are metal materials, were irradiated in a Knudsen cell and supplied onto the p-type layer. Oxygen (O), which is a gaseous material, was supplied as an oxygen radical with an RF radical generator in which $O_2$ gas was used as a raw material. As for the purity of various raw materials that were used, the purity for Zn and Cd was 7N while that for $O_2$ was 6N. The substrate was heated to 700° C. using a resistance heater, and a film of an active layer having a thickness of 1.5 nm was formed while controlling the flux of various gas sources so as to provide a $Cd_{0.2}Zn_{0.8}O$ layer.

(1b) Film Formation of n-Type Layer by Sputtering

Next, a 500 nm thick film of an n-type ZnO layer was formed on the active layer using RF magnetron sputtering. For film formation, a ZnO target to which 2 parts by weight of Al had been added was used, and film formation conditions included a pure Ar atmosphere, a pressure of 0.5 Pa, an applied power of 150 W, and a film formation time of 5 minutes. As a result of evaluating the cross-sectional average diameter of the light emitting functional layer using a method similar to (4a) of Example 1, the average grain diameter at the plate surface of the light emitting functional layer was about 100 μm.

(1c) Production of Light Emitting Device

Using a photolithography process and a vacuum deposition method, Ti/Al/Ni/Au films as a cathode electrode were patterned on the n-type layer in a thickness of 15 nm, 70 nm, 12 nm, and 60 nm, respectively. The cathode electrode was patterned into a shape having an opening so that light can be extracted from a portion where an electrode was not formed. Thereafter, to improve ohmic contact characteristics, 700° C. heat treatment was performed in a nitrogen atmosphere for 30 seconds. Moreover, using a photolithography process and a vacuum deposition method, Ni/Au films as an anode electrode were patterned on the surface on the side opposite to the p-GaN layer and the n-ZnO layer of the self-supporting gallium nitride substrate in a thickness of 5 nm and 100 nm, respectively. Thereafter, to improve ohmic contact characteristics, 500° C. heat treatment was performed in a nitrogen atmosphere for 30 seconds. The wafer obtained in this way was cut into a chip and, further, furnished with a lead frame to obtain a light emitting device having a vertical structure.

(1d) Evaluation of Light Emitting Device

When electricity was applied across the cathode electrode and the anode electrode and I-V measurement was performed, rectifying characteristics were confirmed. Moreover, when an electric current was applied in the forward direction, emission of light having a wavelength of about 400 nm was confirmed.

Example 4

(1) Production of c-Plane Oriented Alumina Sintered Body

A disc-shaped green body was obtained as in (1) of Example 1. The resulting green body was placed in a degreasing furnace and degreased under conditions of 600° C. and 10 hours. The resulting degreased body was fired with a hot pressing under conditions of 1700° C., 4 hours, and a surface pressure of 200 kgf/cm$^2$ in nitrogen using a graphite mold.

The sintered body obtained in this way was fixed to a ceramic surface plate and ground to #2000 using grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Evaluation of the degree of c-plane orientation and the average grain diameter at the plate surface by methods similar to Example 1 resulted in a degree of c-plane orientation of 99% and an average grain diameter of 18 μm.

(2) Production of Ge-Doped Self-Supporting Gallium Nitride Substrate

A seed crystal substrate in which a GaN film having a thickness of 3 μm was stacked on the oriented alumina substrate was produced as in (3a) of Example 1. A Ge-doped GaN film was formed on this seed crystal substrate as in (3b) of Example 1 except that the retention time was 20 hours. In the resulting sample, Ge-doped gallium nitride crystals grew on the entire surface of the 50.8 mm (2 inches) seed crystal substrate, and the crystal thickness was about 0.2 mm. No cracks were observed.

Figure 2:
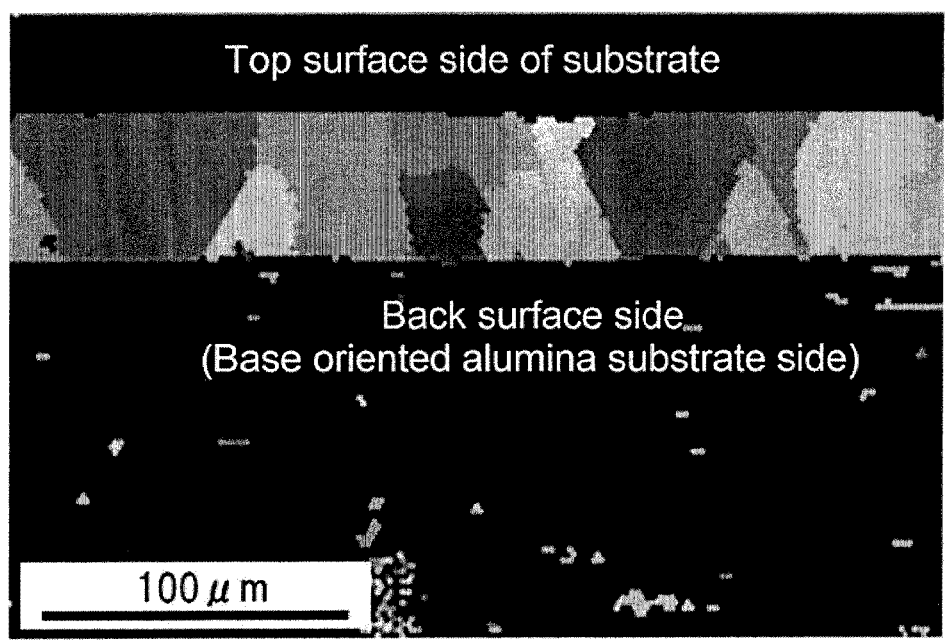
FIG. 2 is an inverse pole figure map of the cross section of gallium nitride crystals measured in Example 4.
Figure 2:
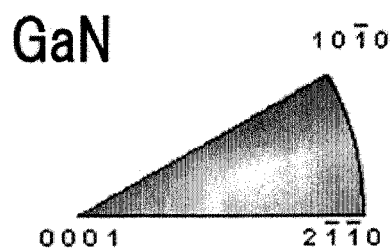
Figure 3:
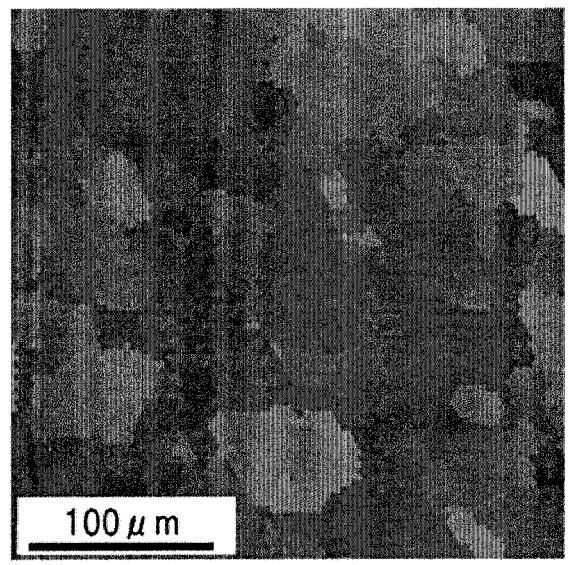
FIG. 3 is an inverse pole figure map of the plate surface (top surface) of gallium nitride crystals measured in Example 4.
Figure 3:
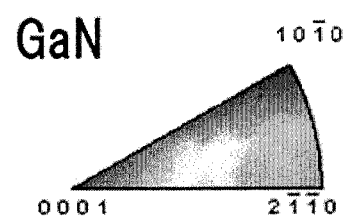
Figure 4:
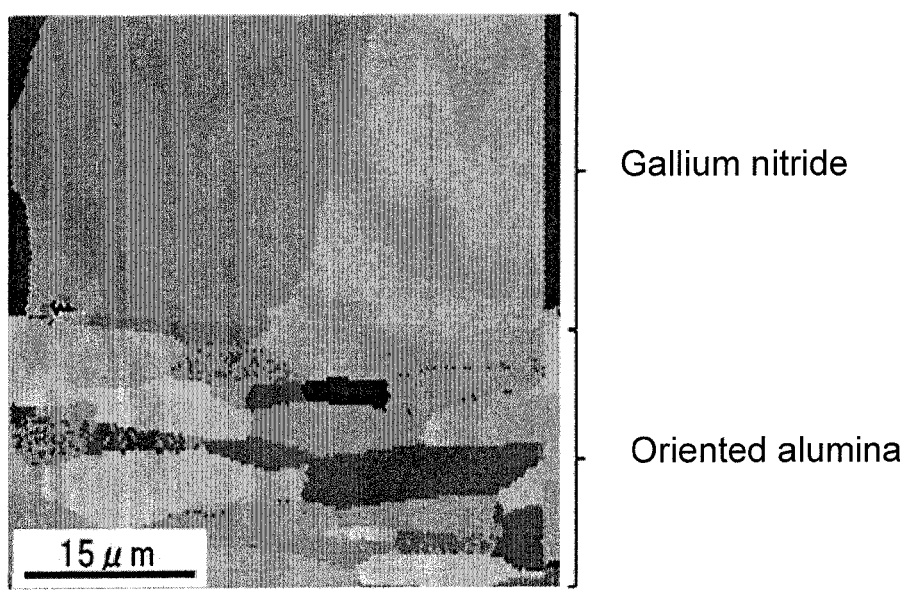
FIG. 4 is a crystal grain map near the interface between gallium nitride crystals and an oriented alumina substrate measured in Example 4.

The plate surface (top surface) of Ge-doped gallium nitride crystals of the sample thus obtained was ground and flattened with #600 and #2000 grinding wheels until the thickness of the gallium nitride crystals became about 50 μm, and then the plate surface was smoothed by lapping using diamond abrasive grains. Next, the sample was cut to expose the plane perpendicular to the plate surface, the plane was polished using a CP polisher (manufactured by JEOL Ltd., IB-09010CP), and then inverse pole figure mapping of the cross section of the gallium nitride crystals was performed with an electron-beam backscattering diffractometer (EBSD) (manufactured by TSL Solutions). FIG. 2 shows an inverse pole figure map. FIG. 3 shows an inverse pole figure map measured at the plate surface (top surface) of the gallium nitride crystals, and FIG. 4 shows a crystal grain map image in which the interface between the oriented alumina substrate and the gallium nitride crystals is enlarged. It can be understood from FIG. 2 that the gallium nitride crystals have a larger grain diameter on the top surface side (the side opposite to the oriented alumina substrate) than the oriented alumina substrate side, and the shape of the gallium nitride crystals, being trapezoidal, triangular, or the like on the cross-sectional image, is not completely columnar. Moreover, it can be understood that, as the film thickens, there are grains whose grain diameter increases and that grow to the top surface, and grains that do not grow to the top surface. FIG. 3 shows that the c-plane of each grain constituting the gallium nitride crystals is mostly oriented in the normal direction. Moreover, it can be understood from FIG. 4 that gallium nitride crystal grains grow, with crystal grains constituting the oriented alumina substrate that serves as a base being a starting point. Although the cause of such a growth behavior that the grain diameter increases as the film thickens is not clear, it is considered that, as conceptually shown in FIG. 5, growth has progressed so that fast-growing grains cover slow-growing grains. Therefore, among the gallium nitride grains constituting the gallium nitride crystals, grains exposed on the top surface side connect to the bottom surface without intervention of a grain boundary, but grains exposed on the bottom surface side include grains which ceased to grow halfway.

Next, the oriented alumina substrate portion of the sample was removed by grinding with grinding wheel to obtain a Ge-doped gallium nitride single body. The bottom surface (the surface on the side that had been in contact with the oriented alumina substrate) of the Ge-doped gallium nitride crystals was subjected to lapping with diamond abrasive grains to obtain a self-supporting gallium nitride substrate, the plate top surface (the side opposite to the side that had been in contact with the oriented alumina substrate) and the bottom surface (the surface on the side that had been in contact with the oriented alumina substrate) of which were smoothed. The average roughness Ra of the top surface and the bottom surface of the self-supporting gallium nitride substrate after processing was 0.2 nm.

The volume resistivity was measured by a method similar to (3) of Example 1, and the volume resistivity was $1 \times 10^{-2}$ Ω·cm. Moreover, as a result of measuring the cross-sectional average diameter of GaN single crystal grains at the top surface and the bottom surface of the self-supporting gallium nitride substrate using a method similar to (3) of Example 1, the cross-sectional average diameter at the top surface was about 50 μm, and the cross-sectional average diameter at the bottom surface was about 18 μm. In this way, the cross-sectional average diameter was larger at the top surface than the bottom surface, and $D_T/D_B$, which is the ratio of the cross-sectional average diameter $D_T$ at the substrate top surface to the cross-sectional average diameter $D_B$ of the substrate bottom surface, was about 2.8. Moreover, the aspect ratio of GaN single crystal grains calculated as the ratio of the thickness of GaN crystals to the cross-sectional average diameter at the top surface was about 1.0.

(3) Production of Light Emitting Device Including Ge-Doped Self-Supporting Gallium Nitride Substrate A light emitting functional layer was produced on the self-supporting gallium nitride substrate as in (4a) of Example 1, and measurement of the cross-sectional average diameter of single crystal grains at the outermost surface resulted in a cross-sectional average diameter of about 50 μm. Moreover, as a result of producing a vertical light emitting device as in (4b) of Example 1, rectifying characteristics were confirmed by I-V measurement between the cathode electrode and the anode electrode, and application of electricity in the forward direction confirmed emission of light having a wavelength of 450 nm.

For reference, a self-supporting substrate having a thickness of 20 μm was also provided by grinding the top surface side of a self-supporting gallium nitride substrate produced as in (1) and (2) described above. At this time, the cross-sectional average diameter of single crystal grains at the outermost surface was about 35 μm; $D_T/D_B$, which is the ratio of the cross-sectional average diameter $D_T$ at the substrate top surface to the cross-sectional average diameter $D_B$ of the substrate bottom surface, was 1.9; and the aspect ratio was about 0.6. When a light emitting functional layer as above was produced on the self-supporting oriented GaN crystals to form a vertical light emitting device and then an electric current was applied in the forward direction, rectifying characteristics and an emission of light having a wavelength of 450 nm were both confirmed and also the luminance of emitted light was somewhat high, but the luminance of emitted light was lower than that of the aforementioned device.

Example 5

(1) Production of c-Plane Oriented Alumina Sintered Body

A plate-shaped alumina powder (manufactured by Kinsei Matec Co., Ltd., grade 02025), a fine alumina powder (manufactured by Taimei Chemicals Co., Ltd., grade TM-DAR), and a magnesium oxide powder (manufactured by Ube Material Industries, Ltd., grade 500 A) were provided as raw materials, and 5 parts by weight of the plate-shaped alumina powder, 95 weight of the fine alumina powder, and 0.025 weight of the magnesium oxide powder were mixed to obtain an alumina raw material. Next, 8 parts by weight of a binder (polyvinyl butyral: product name BM-2, manufactured by Sekisui Chemical Co., Ltd.), 4 parts by weight of a plasticizer (DOP: di(2-ethylhexyl) phthalate, manufactured by Kurogane Kasei Co., Ltd.), 2 parts by weight of a dispersing agent (Rheodol SP-030, manufactured by Kao Corporation), and a dispersion medium (a mixture of xylene and 1-butanol in a weight ratio of 1:1) were mixed with 100 parts by weight of the alumina raw material. The amount of the dispersion medium was adjusted so that the slurry viscosity was 20000 cP. The slurry prepared as above was formed into a sheet on a PET film by a doctor blade method so as to have a thickness after drying of 100 μm. The resulting tape was cut into circles having a diameter of 50.8 mm (2 inches), then 30 pieces were stacked and placed on an Al plate having a thickness of 10 mm, and then vacuum packing was performed. This vacuum pack was subjected to isostatic pressing in hot water at 85° C. under a pressure of 100 kgf/cm$^2$, and a disc-shaped green body was obtained.

The resulting green body was placed in a degreasing furnace and degreased under conditions of 600° C. and 10 hours. The resulting degreased body was fired with a hot pressing under conditions of 1800° C., 4 hours, and a surface pressure of 200 kgf/cm$^2$ in nitrogen using a graphite mold.

The sintered body obtained in this way was fixed to a ceramic surface plate and ground to #2000 using grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Evaluation of the degree of c-plane orientation and the average grain diameter at the plate surface by methods similar to Example 1 resulted in a degree of c-plane orientation of 96% and an average grain diameter of about 20 μm.

(2) Production of Ge-Doped Self-Supporting Gallium Nitride Substrate

A seed crystal substrate in which a GaN film having a thickness of 3 μm was stacked on the oriented alumina substrate was produced as in (3a) of Example 1. A Ge-doped GaN film was formed on this seed crystal substrate as in (3b) of Example 1 except that the retention time was 30 hours. In the resulting sample, Ge-doped gallium nitride crystals grew on the entire surface of the 50.8 mm (2 inches) seed crystal substrate, and the crystal thickness was about 0.3 mm. No cracks were observed.

Figure 5:
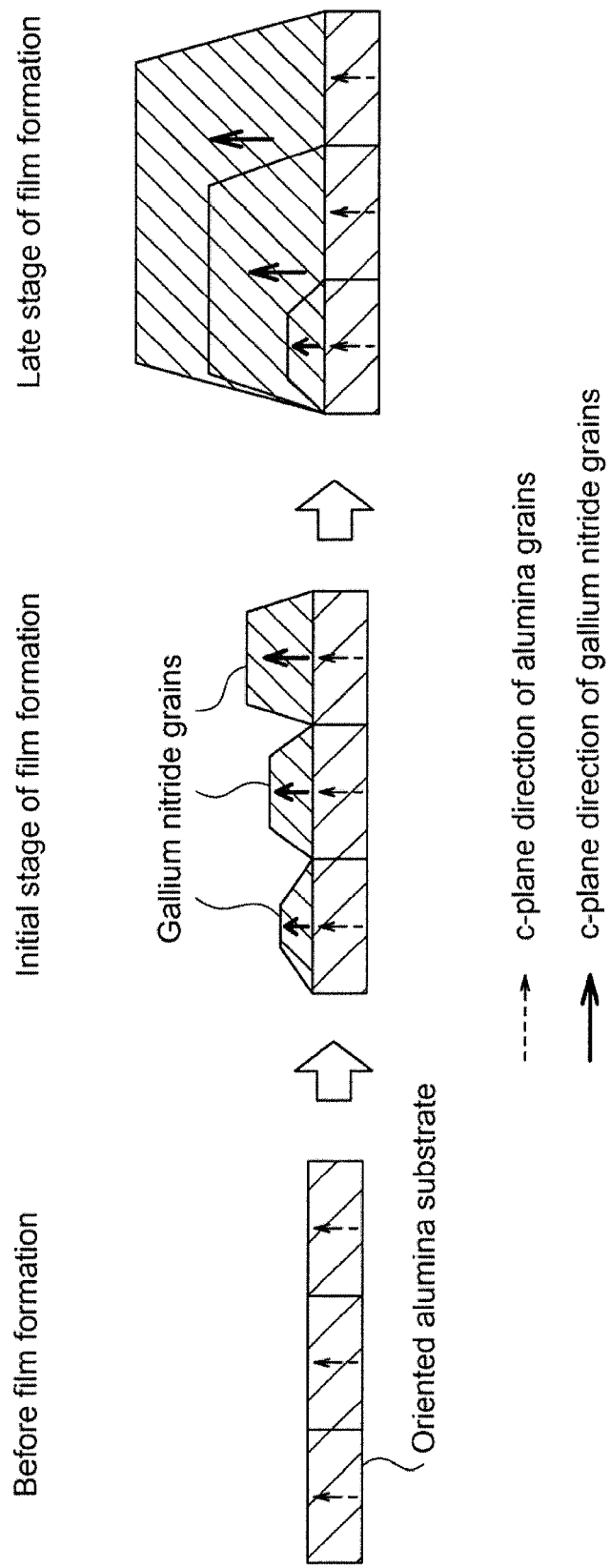
FIG. 5 shows conceptual diagrams of the growth behavior of gallium nitride crystals assessed in Examples 4 and 5.
Figure 6:
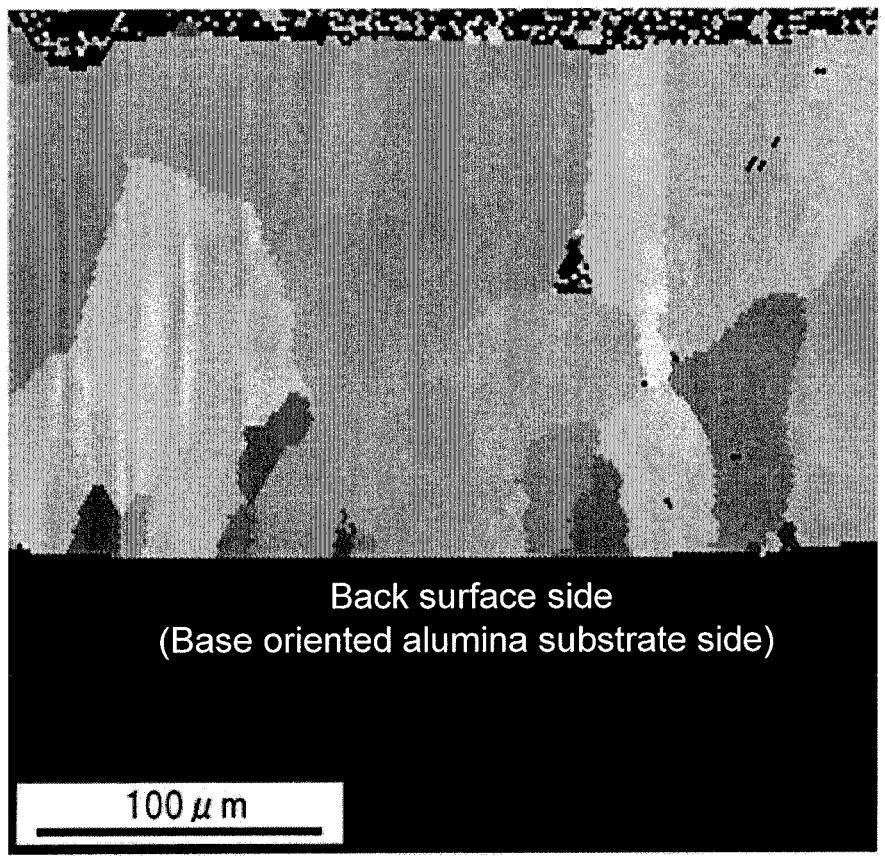
FIG. 6 is an inverse pole figure map of the cross section of gallium nitride crystals measured in Example 5.
Figure 6:
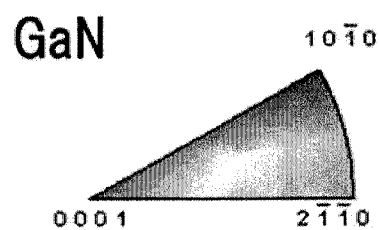

The plate surface (top surface) of Ge-doped gallium nitride crystals of the sample thus obtained was ground and flattened with #600 and #2000 grinding wheels until the thickness of the gallium nitride crystals became about 180 μm, and then the plate surface was smoothed by lapping using diamond abrasive grains. Next, the sample was cut to expose the plane perpendicular to the plate surface, the plane was polished using a CP polisher (manufactured by JEOL Ltd., IB-09010CP), and then inverse pole figure mapping of the cross section of the gallium nitride crystals was performed with an electron-beam backscattering diffractometer (EBSD) (manufactured by TSL Solutions). FIG. 6 shows an inverse pole figure map. It can be understood from FIG. 6 that the gallium nitride crystals have a larger grain diameter on the top surface side (the side opposite to the oriented alumina substrate) than the oriented alumina substrate side, and the shape of the gallium nitride crystals, being trapezoidal, triangular, or the like on the cross-sectional image, is not completely columnar. Moreover, it can be understood that, as the film thickens, there are grains whose grain diameter increases and that grow to the top surface, and grains that do not grow to the top surface. Although the cause of such a growth behavior is not clear, it is considered that, as shown in FIG. 5, such a behavior is a result of growth that progressed in such a manner that fast-growing grains covered slow-growing grains. Therefore, among the gallium nitride grains constituting the gallium nitride crystals, grains exposed on the top surface side connect to the bottom surface without intervention of a grain boundary, but grains exposed on the bottom surface side include grains which ceased to grow halfway.

Next, the oriented alumina substrate portion of the sample was removed by grinding with grinding wheel to obtain a Ge-doped gallium nitride single body. The bottom surface (the surface on the side that had been in contact with the oriented alumina substrate) of the Ge-doped gallium nitride crystals was subjected to lapping with diamond abrasive grains to obtain a self-supporting gallium nitride substrate having a thickness of about 180 µm, the plate top surface (the side opposite to the side that had been in contact with the oriented alumina substrate) and the bottom surface (the surface on the side that had been in contact with the oriented alumina substrate) of which were smoothed. The average roughness Ra of the top surface and the bottom surface of the self-supporting gallium nitride substrate after processing was 0.2 nm.

The volume resistivity was measured by a method similar to (3) of Example 1, and the volume resistivity was $1 \times 10^{-2}$ Ω·cm. Moreover, as a result of measuring the cross-sectional average diameter of GaN single crystal grains at the top surface and the bottom surface of the self-supporting gallium nitride substrate using a method similar to (3) of Example 1, the cross-sectional average diameter at the top surface was about 150 µm, and the cross-sectional average diameter at the bottom surface was about 20 µm. In this way, the cross-sectional average diameter was larger at the top surface than the bottom surface, and $D_T/D_B$, which is the ratio of the cross-sectional average diameter $D_T$ at the substrate top surface to the cross-sectional average diameter $D_B$ of the substrate bottom surface, was about 7.5. Moreover, the aspect ratio of GaN single crystal grains calculated as the ratio of the thickness of GaN crystals to the cross-sectional average diameter at the top surface was about 1.2.

(3) Production of Light Emitting Device Including Ge-Doped Self-Supporting Gallium Nitride Substrate A light emitting functional layer was produced on the self-supporting gallium nitride substrate as in (4a) of Example 1, and measurement of the cross-sectional average diameter of single crystal grains at the outermost surface resulted in a cross-sectional average diameter of about 150 µm. Moreover, as a result of producing a vertical light emitting device as in (4b) of Example 1, rectifying characteristics were confirmed by I-V measurement between the cathode electrode and the anode electrode, and application of electricity in the forward direction confirmed emission of light having a wavelength of 450 nm.

For reference, a self-supporting substrate having a thickness of 50 µm and a self-supporting substrate having a thickness of 20 µm were provided by grinding the top surface side of a self-supporting gallium nitride substrate produced as in (1) and (2) above. The cross-sectional average diameter of single crystal grains at the outermost surface of the self-supporting substrate having a thickness of 50 µm was about 63 µm; $D_T/D_B$, which is the ratio of the cross-sectional average diameter $D_T$ at the substrate top surface to the cross-sectional average diameter $D_B$ of the substrate bottom surface, was 3.2; and the aspect ratio was about 0.8. When a light emitting functional layer as above was produced on the self-supporting oriented GaN crystals to form a vertical light emitting device and then an electric current was applied in the forward direction, rectifying characteristics and an emission of light having a wavelength of 450 nm were both confirmed and also the luminance of emitted light was somewhat high, but the luminance of emitted light was lower than that of the aforementioned device. The cross-sectional average diameter of single crystal grains at the outermost surface of the self-supporting substrate having a thickness of 20 µm was about 39 µm; $D_T/D_B$, which is the ratio of the cross-sectional average diameter $D_T$ at the substrate top surface to the cross-sectional average diameter $D_B$ of the substrate bottom surface, was 2.0; and the aspect ratio was about 0.5. When a light emitting functional layer as above was produced on the self-supporting oriented GaN crystals to form a vertical light emitting device and then an electric current was applied in the forward direction, rectifying characteristics and an emission of light having a wavelength of 450 nm were both confirmed and also the luminance of emitted light was somewhat high, but the luminance of emitted light was further lower than those of the two aforementioned devices.

Example 6

(1) Production of Ge-Doped Self-Supporting Gallium Nitride Substrate

A c-plane oriented alumina substrate was produced as in Example 5, and a GaN film having a thickness of 3 µm was stacked to produce a seed crystal substrate. A Ge-doped GaN film was formed on this seed crystal substrate as in (3b) of Example 1 except that the retention time was 40 hours. In the resulting sample, Ge-doped gallium nitride crystals grew on the entire surface of the 50.8 mm (2 inches) seed crystal substrate, and the crystal thickness was about 0.4 mm. No cracks were observed.

The plate surface (top surface) of Ge-doped gallium nitride crystals of the sample thus obtained was ground and flattened with #600 and #2000 grinding wheels until the thickness of the gallium nitride crystals became about 260 µm, and then the plate surface was smoothed by lapping using diamond abrasive grains. Next, inverse pole figure mapping of the cross section of the gallium nitride crystals was performed using a method similar to Examples 4 and 5, and it was found that the gallium nitride crystals had a larger grain diameter on the top surface side (the side opposite to the oriented alumina substrate) than the oriented alumina substrate side, and the shape of the gallium nitride crystals, being trapezoidal, triangular, or the like on the cross-sectional image, was not completely columnar. Moreover, it was found that, as the film thickened, there were grains whose grain diameter increased and that grew to the top surface, and grains that did not grow to the top surface. Although the cause of such a growth behavior is not clear, it is considered that, as shown in FIG. 5, such a behavior is a result of growth that progressed in such a manner that fast-growing grains covered slow-growing grains. Therefore, among the gallium nitride grains constituting the gallium nitride crystals, grains exposed on the top surface side connect to the bottom surface without intervention of a grain boundary, but grains exposed on the bottom surface side include grains which ceased to grow halfway.

Next, the oriented alumina substrate portion of the sample was removed by grinding with grinding wheel to obtain a Ge-doped gallium nitride single body. The bottom surface (the surface on the side that had been in contact with the oriented alumina substrate) of the Ge-doped gallium nitride crystals was subjected to lapping with diamond abrasive grains to obtain a self-supporting gallium nitride substrate having a thickness of about 260 μm, the plate top surface (the side opposite to the side that had been in contact with the oriented alumina substrate) and the bottom surface (the surface on the side that had been in contact with the oriented alumina substrate) of which were smoothed. The average roughness Ra of the top surface and the bottom surface of the self-supporting gallium nitride substrate after processing was 0.2 nm.

The volume resistivity was measured by a method similar to (3) of Example 1, and the volume resistivity was $1 \times 10^{-2}$ Ω·cm. Moreover, as a result of measuring the cross-sectional average diameter of GaN single crystal grains at the top surface and the bottom surface of the self-supporting gallium nitride substrate using a method similar to (3) of Example 1, the cross-sectional average diameter at the top surface was about 220 μm, and the cross-sectional average diameter at the bottom surface was about 20 μm. In this way, the cross-sectional average diameter was larger at the top surface than the bottom surface, and $D_T/D_B$, which is the ratio of the cross-sectional average diameter $D_T$ at the substrate top surface to the cross-sectional average diameter $D_B$ of the substrate bottom surface, was about 11.0. Moreover, the aspect ratio of GaN single crystal grains calculated as the ratio of the thickness of GaN crystals to the cross-sectional average diameter at the top surface was about 1.2.

(2) Production of Light Emitting Device Including Ge-Doped Self-Supporting Gallium Nitride Substrate A light emitting functional layer was produced on the self-supporting gallium nitride substrate as in (4a) of Example 1, and measurement of the cross-sectional average diameter of single crystal grains at the outermost surface resulted in a cross-sectional average diameter of about 220 μm. Moreover, as a result of producing a vertical light emitting device as in (4b) of Example 1, rectifying characteristics were confirmed by I-V measurement between the cathode electrode and the anode electrode, and application of electricity in the forward direction confirmed emission of light having a wavelength of 450 nm. It was found that the luminance was somewhat high but lower than that of the device of Example 5.

Example 7

(1) Production of c-Plane Oriented Alumina Sintered Body

A c-plane oriented alumina substrate was produced as in Example 1 except that the firing temperature with a hot pressing was 1750° C. The sintered body obtained in this way was fixed to a ceramic surface plate and ground to #2000 using grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Evaluation of the degree of c-plane orientation and the average grain diameter at the plate surface by methods similar to Example 1 resulted in a degree of c-plane orientation of 96% and an average grain diameter of 14 μm.

(2) Production of Ge-Doped Self-Supporting Gallium Nitride Substrate

A seed crystal substrate in which a GaN film having a thickness of 3 μm was stacked on the oriented alumina substrate was produced as in (3a) of Example 1. A Ge-doped GaN film was formed on this seed crystal substrate as in (3b) of Example 1 except that the retention time was 30 hours. In the resulting sample, Ge-doped gallium nitride crystals grew on the entire surface of the 50.8 mm (2 inches) seed crystal substrate, and the crystal thickness was about 0.3 mm. No cracks were observed.

The plate surface (top surface) of Ge-doped gallium nitride crystals of the sample thus obtained was ground and flattened with #600 and #2000 grinding wheels until the thickness of the gallium nitride crystals became about 90 μm, and then the plate surface was smoothed by lapping using diamond abrasive grains. Next, inverse pole figure mapping of the cross section of the gallium nitride crystals was performed using a method similar to Examples 4 to 6, and it was found that the gallium nitride crystals had a larger grain diameter on the top surface side (the side opposite to the oriented alumina substrate) than the oriented alumina substrate side, and the shape of the gallium nitride crystals, being trapezoidal, triangular, or the like on the cross-sectional image, was not completely columnar. Moreover, it was found that, as the film thickens, there were grains whose grain diameter increased and that grew to the top surface, and grains that did not grow to the top surface. Although the cause of such a growth behavior is not clear, it is considered that, as shown in FIG. 5, such a behavior is a result of growth that progressed in such a manner that fast-growing grains covered slow-growing grains. Therefore, among the gallium nitride grains constituting the gallium nitride crystals, grains exposed on the top surface side connect to the bottom surface without intervention of a grain boundary, but grains exposed on the bottom surface side include grains which ceased to grow halfway.

Next, the oriented alumina substrate portion of the sample was removed by grinding with grinding wheel to obtain a Ge-doped gallium nitride single body. The bottom surface (the surface on the side that had been in contact with the oriented alumina substrate) of the Ge-doped gallium nitride crystals was subjected to lapping by diamond abrasive grains to obtain a self-supporting gallium nitride substrate having a thickness of about 90 μm, the plate top surface (the side opposite to the side that had been in contact with the oriented alumina substrate) and the bottom surface (the surface on the side that had been in contact with the oriented alumina substrate) of which were smoothed (Example 7-1). The average roughness Ra of the top surface and the bottom surface of the self-supporting gallium nitride substrate after processing was 0.2 nm.

Moreover, Ge-doped gallium nitride crystals were produced as above and the plate surface (top surface) thereof was ground using #600 and #2000 grinding wheels to produce samples in which the thicknesses of the gallium nitride crystals were 70, 50, 30, and 20 μm, and the plate surfaces were smoothed by lapping using diamond abrasive grains. Next, the alumina substrate portions were removed as above, the bottom surfaces (the surfaces on the side that had been in contact with the oriented alumina substrates) of the Ge-doped gallium nitride crystals were subjected to lapping by diamond abrasive grains to obtain self-supporting gallium nitride substrates having thicknesses of 70, 50, 30, and 20 μm, the plate top surfaces (the side opposite to the side that had been in contact with the oriented alumina substrates) and the bottom surfaces (the surfaces on the side that had been in contact with the oriented alumina substrates) of which were smoothed (Example 7-2 to Example 7-5). The average roughness Ra of the top surface and the bottom surface of each sample after processing was 0.2 nm.

The volume resistivity of each sample was measured by a method similar to (3) of Example 1, and the volume resistivity was all $1\times10^{-2}$ Ω·cm. Moreover, as a result of measuring the cross-sectional average diameter of GaN single crystal grains at the top surface and the bottom surface of each self-supporting gallium nitride substrate using a method similar to (3) of Example 1, the thickness of each self-supporting gallium nitride substrate, the cross-sectional average diameter at the top surface, the cross-sectional average diameter at the bottom surface, the ratio $D_T/D_B$ of the cross-sectional average diameter $D_T$ of the substrate top surface to the cross-sectional average diameter $D_B$ of the substrate bottom surface, and the aspect ratio of GaN single crystal grains calculated as the ratio of the thickness of GaN crystals to the cross-sectional average diameter at the top surface were as shown in Table 1.

TABLE 1

| No. | Thickness of self-supporting gallium nitride substrate (μm) | $D_T$ (μm) | $D_B$ (μm) | $D_T/D_B$ | Aspect ratio | Average cross-sectional diameter at outermost surface of light emitting functional layer (μm) |
|---|---|---|---|---|---|---|
| Ex. 7-1 | 90 | 76 | 14 | 5.4 | 1.2 | 76 |
| Ex. 7-2 | 70 | 59 | 14 | 4.2 | 1.2 | 59 |
| Ex. 7-3 | 50 | 42 | 14 | 3.0 | 1.2 | 42 |
| Ex. 7-4 | 30 | 25 | 14 | 1.8 | 1.2 | 25 |
| Ex. 7-5 | 20 | 17 | 14 | 1.2 | 1.2 | 17 |

(3) Production of Light Emitting Device Including Ge-Doped Self-Supporting Gallium Nitride Substrate A light emitting functional layer was produced on each self-supporting gallium nitride substrate as in (4a) of Example 1. The result of measuring the cross-sectional average diameter of single crystal grains at the outermost surface is shown in Table 1. As a result of producing vertical light emitting devices as in (4b) of Example 1, rectifying characteristics were confirmed by I-V measurement between the cathode electrode and the anode electrode in all samples, and application of electricity in the forward direction confirmed emission of light having a wavelength of 450 nm. The luminances were all somewhat high and had a relationship of Example 7-1>Example 7-2>Example 7-3>Example 7-4>Example 7-5.

Example 8

(1) Production of c-Plane Oriented Alumina Sintered Body

A plate-shaped alumina powder (manufactured by Kinsei Matec Co., Ltd., grade 02025), a fine alumina powder (manufactured by Taimei Chemicals Co., Ltd., grade TM-DAR), aluminum fluoride (manufactured by Kanto Chemical Co., Inc.), and a magnesium oxide powder (manufactured by Ube Material Industries, Ltd., grade 500 A) were provided as raw materials, and 5 parts by weight of the plate-shaped alumina powder, 95 parts by weight of the fine alumina powder, 0.05 parts by weight of the aluminum fluoride powder, and 0.025 parts by weight of the magnesium oxide powder were mixed to obtain an alumina raw material. Next, 8 parts by weight of a binder (polyvinyl butyral: product name BM-2, manufactured by Sekisui Chemical Co., Ltd.), 4 parts by weight of a plasticizer (DOP: di(2-ethylhexyl) phthalate, manufactured by Kurogane Kasei Co., Ltd.), 2 parts by weight of a dispersing agent (Rheodol SP-030, manufactured by Kao Corporation), and a dispersion medium (a mixture of xylene and 1-butanol in a weight ratio of 1:1) were mixed with 100 parts by weight of the alumina raw material. The amount of the dispersion medium was adjusted so that the slurry viscosity was 20000 cP. The slurry prepared as above was formed into a sheet on a PET film by a doctor blade method so as to have a thickness after drying of 100 μm. The resulting tape was cut into circles having a diameter of 50.8 mm (2 inches), then 30 pieces were stacked and placed on an Al plate having a thickness of 10 mm, and then vacuum packing was performed. This vacuum pack was subjected to isostatic pressing in hot water at 85° C. under a pressure of 100 kgf/cm², and a disc-shaped green body was obtained.

The resulting green body was placed in a degreasing furnace and degreased under conditions of 600° C. and 10 hours. The resulting degreased body was fired with a hot pressing under conditions of 1800° C., 4 hours, and a surface pressure of 200 kgf/cm² in nitrogen using a graphite mold.

The sintered body obtained in this way was fixed to a ceramic surface plate and ground to #2000 using grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Evaluation of the degree of c-plane orientation and the average grain diameter at the plate surface by methods similar to Example 1 resulted in a degree of c-plane orientation of 92% and an average grain diameter of about 64 μm.

(2) Production of Ge-Doped Self-Supporting Gallium Nitride Substrate

A seed crystal substrate in which a GaN film having a thickness of 3 μm was stacked on the oriented alumina substrate was produced as in (3a) of Example 1. A Ge-doped GaN film was formed on this seed crystal substrate as in (3b) of Example 1 except that the retention time was 30 hours. In the resulting sample, Ge-doped gallium nitride crystals grew on the entire surface of the 50.8 mm (2 inches) seed crystal substrate, and the crystal thickness was about 0.3 mm. No cracks were observed.

The plate surface (top surface) of Ge-doped gallium nitride crystals of the sample thus obtained were ground and flattened with #600 and #2000 grinding wheels until the thickness of the gallium nitride crystals became about 90 μm, and then the plate surface was smoothed by lapping using diamond abrasive grains. Next, inverse pole figure mapping of the cross section of the gallium nitride crystals was performed using a method similar to Examples 4 to 7, and it was found that the gallium nitride crystals had a larger grain diameter on the top surface side (the side opposite to the oriented alumina substrate) than the oriented alumina substrate side, and the shape of the gallium nitride crystals, being trapezoidal, triangular, or the like on the cross-sectional image, was not completely columnar. Moreover, it was found that, as the film thickened, there were grains whose grain diameter increased and that grew to the top surface, and grains that did not grow to the top surface. Although the cause of such a growth behavior is not clear, it is considered that, as shown in FIG. 5, such a behavior is a result of growth that progressed in such a manner that fast-growing grains covered slow-growing grains. Therefore, among the gallium nitride grains constituting the gallium nitride crystals, grains exposed on the top surface side connect to the bottom surface without intervention of a grain boundary, but grains exposed on the bottom surface side include grains which ceased to grow halfway.

Next, the oriented alumina substrate portion of the sample was removed by grinding with grinding wheel to obtain a Ge-doped gallium nitride single body. The bottom surface (the surface on the side that had been in contact with the oriented alumina substrate) of the Ge-doped gallium nitride crystals was subjected to lapping with diamond abrasive grains to obtain a self-supporting gallium nitride substrate having a thickness of about 90 μm, the plate top surface and the bottom surface (the surface on the side that had been in contact with the oriented alumina substrate) of which were smoothed. The average roughness Ra of the top surface and the bottom surface of the self-supporting gallium nitride substrate after processing was 0.2 nm.

The volume resistivity was measured by a method similar to (3) of Example 1, and the volume resistivity was $1 \times 10^{-2}$ Ω·cm. Moreover, as a result of measuring the cross-sectional average diameter of GaN single crystal grains at the top surface and the bottom surface of the self-supporting gallium nitride substrate using a method similar to (3) of Example 1, the cross-sectional average diameter at the top surface was about 80 μm, and the cross-sectional average diameter at the bottom surface was about 64 μm. In this way, the cross-sectional average diameter was larger at the top surface than the bottom surface, and $D_T/D_B$, which is the ratio of the cross-sectional average diameter $D_T$ at the substrate top surface to the cross-sectional average diameter $D_B$ of the substrate bottom surface, was about 1.3. Moreover, the aspect ratio of GaN single crystal grains calculated as the ratio of the thickness of GaN crystals to the cross-sectional average diameter at the top surface was about 1.1.

(3) Production of Light Emitting Device Including Ge-Doped Self-Supporting Gallium Nitride Substrate A light emitting functional layer was produced on the self-supporting gallium nitride substrate as in (4a) of Example 1, and measurement of the cross-sectional average diameter of single crystal grains at the outermost surface resulted in a cross-sectional average diameter of about 80 μm. Moreover, as a result of producing a vertical light emitting device as in (4b) of Example 1, rectifying characteristics were confirmed by I-V measurement between the cathode electrode and the anode electrode, and application of electricity in the forward direction confirmed emission of light having a wavelength of 450 nm.

Example 9

(1) Production of c-Plane Oriented Alumina Sintered Body

A c-plane oriented alumina substrate was produced as in Example 8 except that the amount of aluminum fluoride powder was 0.02 parts by weight. The sintered body obtained in this way was fixed to a ceramic surface plate and ground to #2000 using grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Evaluation of the degree of c-plane orientation and the average grain diameter at the plate surface by methods similar to Example 1 resulted in a degree of c-plane orientation of 94% and an average grain diameter of 41 μm.

(2) Production of Ge-Doped Self-Supporting Gallium Nitride Substrate

A seed crystal substrate in which a GaN film having a thickness of 3 μm was stacked on the oriented alumina substrate was produced as in (3a) of Example 1. A Ge-doped GaN film was formed on this seed crystal substrate as in (3b) of Example 1 except that the retention time was 30 hours. In the resulting sample, Ge-doped gallium nitride crystals grew on the entire surface of the 50.8 mm (2 inches) seed crystal substrate, and the crystal thickness was about 0.3 mm. No cracks were observed.

The oriented alumina substrate portion of the sample obtained in this way was removed by grinding with grinding wheel to obtain a Ge-doped gallium nitride single body. Then, the bottom surface (the surface on the side that had been in contact with the oriented alumina substrate) of the Ge-doped gallium nitride crystals was ground by about 80 μm using #600 and #2000 grinding wheels. Thereafter, the plate surface (top surface) was flattened by grinding until the thickness of the gallium nitride crystals became 60 μm, and then the top surface and the bottom surface were smoothed by lapping using diamond abrasive grains to obtain a self-supporting gallium nitride substrate having a thickness of about 60 μm. The average roughness Ra of the top surface and the bottom surface of the self-supporting gallium nitride substrate after processing was 0.2 nm.

Next, inverse pole figure mapping of the cross section of the gallium nitride crystals was performed using a method similar to Examples 4 to 8, and it was found that the gallium nitride crystals had a larger grain diameter on the top surface side (the side opposite to the oriented alumina substrate) than the oriented alumina substrate side, and the shape of the gallium nitride crystals, being trapezoidal, triangular, or the like on the cross-sectional image, was not completely columnar. Moreover, it was found that, as the film thickened, there were grains whose grain diameter increased and that grew to the top surface, and grains that did not grow to the top surface. Although the cause of such a growth behavior is not clear, it is considered that, as shown in FIG. 5, such a behavior is a result of growth that progressed in such a manner that fast-growing grains covered slow-growing grains. Therefore, among the gallium nitride grains constituting the gallium nitride crystals, grains exposed on the top surface side connect to the bottom surface without intervention of a grain boundary, but grains exposed on the bottom surface side include grains which ceased to grow halfway.

The volume resistivity was measured by a method similar to (3) of Example 1, and the volume resistivity was $1 \times 10^{-2}$ $\Omega \cdot$cm. Moreover, as a result of measuring the cross-sectional average diameter of GaN single crystal grains at the top surface and the bottom surface of the self-supporting gallium nitride substrate using a method similar to (3) of Example 1, the cross-sectional average diameter at the top surface was about 81 μm, and the cross-sectional average diameter at the bottom surface was about 61 μm. In this way, the cross-sectional average diameter was larger at the top surface than the bottom surface, and $D_T/D_B$, which is the ratio of the cross-sectional average diameter $D_T$ at the substrate top surface to the cross-sectional average diameter $D_B$ of the substrate bottom surface, was about 1.3. Moreover, the aspect ratio of GaN single crystal grains calculated as the ratio of the thickness of GaN crystals to the cross-sectional average diameter at the top surface was about 0.7.

(3) Production of Light Emitting Device Including Ge-Doped Self-Supporting Gallium Nitride Substrate A light emitting functional layer was produced on the self-supporting gallium nitride substrate as in (4a) of Example 1, and measurement of the cross-sectional average diameter of single crystal grains at the outermost surface resulted in a cross-sectional average diameter of about 81 μm. Moreover, as a result of producing a vertical light emitting device as in (4b) of Example 1, rectifying characteristics were confirmed by I-V measurement between the cathode electrode and the anode electrode, and application of electricity in the forward direction confirmed emission of light having a wavelength of 450 nm. However, it was found that the luminance was somewhat high but weaker than that in Example 8.

Example 10

(1) Production of c-Plane Oriented Alumina Sintered Body

A plate-shaped alumina powder (manufactured by Kinsei Matec Co., Ltd., grade 10030), a fine alumina powder (manufactured by Taimei Chemicals Co., Ltd., grade TM-DAR), and a magnesium oxide powder (manufactured by Ube Material Industries, Ltd., grade 500 A) were prepared as raw materials, and 5 parts by weight of the plate-shaped alumina powder, 95 parts by weight of the fine alumina powder, and 0.025 parts by weight of the magnesium oxide powder were mixed to obtain an alumina raw material. Next, 8 parts by weight of a binder (polyvinyl butyral: product name BM-2, manufactured by Sekisui Chemical Co., Ltd.), 4 parts by weight of a plasticizer (DOP: di(2-ethylhexyl) phthalate, manufactured by Kurogane Kasei Co., Ltd.), 2 parts by weight of a dispersing agent (Rheodol SP-030, manufactured by Kao Corporation), and a dispersion medium (a mixture of xylene and 1-butanol in a weight ratio of 1:1) were mixed with 100 parts by weight of the alumina raw material. The amount of the dispersion medium was adjusted so that the slurry viscosity was 20000 cP. The slurry prepared as above was formed into a sheet on a PET film by a doctor blade method so as to have a thickness after drying of 100 μm. The resulting tape was cut into circles having a diameter of 50.8 mm (2 inches), then 30 pieces were stacked and placed on an Al plate having a thickness of 10 mm, and then vacuum packing was performed. This vacuum pack was subjected to isostatic pressing in hot water at 85° C. under a pressure of 100 kgf/cm², and a disc-shaped green body was obtained.

The resulting green body was placed in a degreasing furnace and degreased under conditions of 600° C. and 10 hours. The resulting degreased body was fired with a hot pressing under conditions of 1800° C., 4 hours, and a surface pressure of 200 kgf/cm² in nitrogen using a graphite mold.

The sintered body obtained in this way was fixed to a ceramic surface plate and ground to #2000 using grinding wheel to flatten the plate surface. Next, the plate surface was smoothed by lapping using diamond abrasive grains to obtain an oriented alumina sintered body having a diameter of 50.8 mm (2 inches) and a thickness of 1 mm as an oriented alumina substrate. Flatness was improved by reducing the size of abrasive grains from 3 μm to 0.5 μm in a stepwise manner. The average roughness Ra after processing was 4 nm. Evaluation of the degree of c-plane orientation and the average grain diameter at the plate surface by methods similar to Example 1 resulted in a degree of c-plane orientation of 99% and an average grain diameter of about 24 μm.

(2) Production of Ge-Doped Self-Supporting Gallium Nitride Substrate

A seed crystal substrate in which a GaN film having a thickness of 3 μm was stacked on the oriented alumina substrate was produced as in (3a) of Example 1. A Ge-doped GaN film was formed on this seed crystal substrate as in (3b) of Example 1 except that the retention time was 30 hours. In the resulting sample, Ge-doped gallium nitride crystals grew on the entire surface of the 50.8 mm (2 inches) seed crystal substrate, and the crystal thickness was about 0.3 mm. No cracks were observed.

The oriented alumina substrate portion of the sample obtained in this way was removed by grinding with grinding wheel to obtain a Ge-doped gallium nitride single body. Then, the bottom surface (the surface on the side that had been in contact with the oriented alumina substrate) of the Ge-doped gallium nitride crystals was ground by about 90 μm using #600 and #2000 grinding wheels. Thereafter, the plate surface (top surface) was flattened by grinding until the thickness of the gallium nitride crystals became 40 μm, and then the top surface and the bottom surface were smoothed by lapping using diamond abrasive grains to obtain a self-supporting gallium nitride substrate having a thickness of about 40 μm. The average roughness Ra of the top surface and the bottom surface of the self-supporting gallium nitride substrate after processing was 0.2 nm.

Next, inverse pole figure mapping of the cross section of the gallium nitride crystals was performed using a method similar to Examples 4 to 9, and it was found that the gallium nitride crystals had a larger grain diameter on the top surface side (the side opposite to the oriented alumina substrate) than the oriented alumina substrate side, and the shape of the gallium nitride crystals, being trapezoidal, triangular, or the like on the cross-sectional image, was not completely columnar. Moreover, it was found that, as the film thickened, there were grains whose grain diameter increased and that grew to the top surface, and grains that did not grow to the top surface. Although the cause of such a growth behavior is not clear, it is considered that, as shown in FIG. 5, such a behavior is a result of growth that progressed in such a manner that fast-growing grains covered slow-growing grains. Therefore, among the gallium nitride grains constituting the gallium nitride crystals, grains exposed on the top surface side connect to the bottom surface without intervention of a grain boundary, but grains exposed on the bottom surface side include grains which ceased to grow halfway.

The volume resistivity was measured by a method similar to (3) of Example 1, and the volume resistivity was $1\times10^2$ Ω·cm. Moreover, as a result of measuring the cross-sectional average diameter of GaN single crystal grains at the top surface and the bottom surface of the self-supporting gallium nitride substrate using a method similar to (3) of Example 1, the cross-sectional average diameter at the top surface was about 75 μm, and the cross-sectional average diameter at the bottom surface was about 60 μm. In this way, the cross-sectional average diameter was larger at the top surface than the bottom surface, and $D_T/D_B$, which is the ratio of the cross-sectional average diameter $D_T$ at the substrate top surface to the cross-sectional average diameter $D_B$ of the substrate bottom surface, was about 1.3. Moreover, the aspect ratio of GaN single crystal grains calculated as the ratio of the thickness of GaN crystals to the cross-sectional average diameter at the top surface was about 0.5.

(3) Production of Light Emitting Device Including Ge-Doped Self-Supporting Gallium Nitride Substrate A light emitting functional layer was produced on the self-supporting gallium nitride substrate as in (4a) of Example 1, and measurement of the cross-sectional average diameter of single crystal grains at the outermost surface resulted in a cross-sectional average diameter of about 75 μm. Moreover, as a result of producing a vertical light emitting device as in (4b) of Example 1, rectifying characteristics were confirmed by I-V measurement between the cathode electrode and the anode electrode, and application of electricity in the forward direction confirmed emission of light having a wavelength of 450 nm. However, it was found that the luminance was somewhat high but weaker than that in Examples 8 and 9.

The invention claimed is:

1. A self-supporting gallium nitride substrate composed of a plate composed of a plurality of gallium nitride-based single crystal grains, wherein the plate has a single crystal structure in an approximately normal direction, wherein an aspect ratio $T/D_T$, which is defined as a ratio of a thickness T of the self-supporting gallium nitride substrate to a cross-sectional average diameter $D_T$ at an outermost surface of the gallium nitride-based single crystal grains exposed at a top surface of the self-supporting gallium nitride substrate, is 0.7 or greater.

2. The self-supporting gallium nitride substrate according to claim 1, wherein a cross-sectional average diameter of the gallium nitride-based single crystal grains at an outermost surface of the substrate is 0.3 μm or greater.

3. The self-supporting gallium nitride substrate according to claim 2, wherein the cross-sectional average diameter is 3 μm or greater.

4. The self-supporting gallium nitride substrate according to claim 2, wherein the cross-sectional average diameter is 20 μm or greater.

5. The self-supporting gallium nitride substrate according to claim 1, having a thickness of 20 μm or greater.

6. The self-supporting gallium nitride substrate according to claim 1, having a diameter of 100 mm or greater.

7. The self-supporting gallium nitride substrate according to claim 1, wherein the gallium nitride-based single crystal grains have crystal orientation that is mostly aligned in the approximately normal direction.

8. The self-supporting gallium nitride substrate according to claim 1, wherein the gallium nitride-based single crystal grains are doped with an n-type dopant or a p-type dopant.

9. The self-supporting gallium nitride substrate according to claim 1, wherein the gallium nitride-based single crystal grains are free from a dopant.

10. The self-supporting gallium nitride substrate according to claim 1, wherein the gallium nitride-based single crystal grains are made of a mixed crystal.

11. The self-supporting gallium nitride substrate according to claim 1, wherein the gallium nitride-based single crystal grains exposed at a top surface of the self-supporting gallium nitride substrate connect to a bottom surface of the self-supporting gallium nitride substrate without intervention of a grain boundary.

12. The self-supporting gallium nitride substrate according to claim 1, wherein a ratio $D_T/D_B$, which is a ratio of a cross-sectional average diameter $D_T$ at an outermost surface of the gallium nitride-based single crystal grains exposed at a top surface of the self-supporting gallium nitride substrate to a cross-sectional average diameter $D_B$ at an outermost surface of the gallium nitride-based single crystal grains exposed at a bottom surface of the self-supporting gallium nitride substrate, is greater than 1.0.

13. The self-supporting gallium nitride substrate according to claim 1, wherein the aspect ratio $T/D_T$ is 1.0 or greater.

14. A light emitting device comprising:
    the self-supporting gallium nitride substrate according to claim 1; and
    a light emitting functional layer formed on the substrate, wherein the light emitting functional layer has at least one layer composed of a plurality of semiconductor single crystal grains, wherein the at least one layer has a single crystal structure in an approximately normal direction.

15. The light emitting device according to claim 14, wherein a cross-sectional average diameter of the semiconductor single crystal grains at an outermost surface of the light emitting functional layer is 0.3 μm or greater.

16. The light emitting device according to claim 15, wherein the cross-sectional average diameter is 3 μm or greater.

17. The light emitting device according to claim 14, wherein the semiconductor single crystal grains have a structure in which grains are grown mostly in conformity with crystal orientation of the self-supporting gallium nitride substrate.

18. The light emitting device according to claim 14, wherein the light emitting functional layer is composed of a gallium nitride-based material.

19. A method for manufacturing a light emitting device, comprising the steps of:
    providing the self-supporting gallium nitride substrate of claim 1; and
    forming on the self-supporting gallium nitride substrate at least one layer composed of a plurality of semiconductor single crystal grains, wherein the at least one layer has a single crystal structure in an approximately normal direction, so that the at least one layer has crystal orientation mostly in conformity with crystal orientation of the self-supporting gallium nitride substrate, thereby providing a light emitting functional layer.

20. The method according to claim 19, wherein the light emitting functional layer is composed of a gallium nitride-based material.

21. A method for manufacturing a self-supporting gallium nitride substrate, comprising the steps of:
   providing an oriented polycrystalline sintered body;
   forming a seed crystal layer composed of gallium nitride on the oriented polycrystalline sintered body so that the seed crystal layer has crystal orientation mostly in conformity with crystal orientation of the oriented polycrystalline sintered body;
   forming a layer with a thickness of 20 μm or greater composed of gallium nitride-based crystals on the seed crystal layer so that the layer has crystal orientation mostly in conformity with crystal orientation of the seed crystal layer; and
   removing the oriented polycrystalline sintered body to obtain the self-supporting gallium nitride substrate, wherein an aspect ratio $T/D_T$, which is defined as a ratio of a thickness T of the self-supporting gallium nitride substrate to a cross-sectional average diameter $D_T$ at an outermost surface of the gallium nitride-based single crystal grains exposed at a top surface of the self-supporting gallium nitride substrate, is 0.7 or greater.

22. The method according to claim 21, wherein the oriented polycrystalline sintered body is an oriented polycrystalline alumina sintered body.

23. The method according to claim 21, wherein an average grain diameter of grains constituting the oriented polycrystalline sintered body on a plate surface is 0.3 to 1000 μm.

24. The method according to claim 21, wherein formation of the layer composed of the gallium nitride-based crystals is performed by Na flux method.

25. The method according to claim 21, wherein the oriented polycrystalline sintered body is transparent or translucent.

* * * * *